(12) United States Patent
Tanaka et al.

(10) Patent No.: US 9,250,121 B2
(45) Date of Patent: Feb. 2, 2016

(54) IMAGING APPARATUS WITH PLURAL COLOR FILTERS AND IMAGE PROCESSING

(71) Applicants: TOKYO INSTITUTE OF TECHNOLOGY, Tokyo (JP); OLYMPUS CORPORATION, Tokyo (JP)

(72) Inventors: Masayuki Tanaka, Tokyo (JP); Yusuke Monno, Tokyo (JP); Masatoshi Okutomi, Tokyo (JP); Sunao Kikuchi, Tokyo (JP); Yasuhiro Komiya, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 113 days.

(21) Appl. No.: 14/064,612

(22) Filed: Oct. 28, 2013

(65) Prior Publication Data

US 2014/0118586 A1    May 1, 2014

Related U.S. Application Data

(63) Continuation of application No. PCT/JP2012/003068, filed on May 10, 2012.

(30) Foreign Application Priority Data

May 11, 2011    (JP) .................................. 2011-106740

(51) Int. Cl.
*H04N 5/335*    (2011.01)
*G01J 1/04*    (2006.01)
*G02B 5/20*    (2006.01)
*H01L 27/146*    (2006.01)
*H04N 9/04*    (2006.01)

(52) U.S. Cl.
CPC ............... *G01J 1/0492* (2013.01); *G02B 5/201* (2013.01); *H01L 27/14621* (2013.01); *H01L 27/14625* (2013.01); *H01L 27/14643* (2013.01); *H04N 9/045* (2013.01); *H01L 27/14645* (2013.01)

(58) Field of Classification Search
CPC ........... H04N 9/045; H04N 9/67; H04N 9/75; H04N 2209/045
USPC .......................................................... 348/278
See application file for complete search history.

(56) References Cited

U.S. PATENT DOCUMENTS

2011/0149126 A1* 6/2011 Mitsui et al. ................... 348/278

FOREIGN PATENT DOCUMENTS

| JP | 2003-087806 A | 3/2003 |
| JP | 2009-284010 A | 12/2009 |
| JP | 2009-290607 A | 12/2009 |

OTHER PUBLICATIONS

International Search Report dated Aug. 7, 2012 issued in PCT/JP2012/003068.

*Primary Examiner* — Usman Khan
(74) *Attorney, Agent, or Firm* — Scully, Scott, Murphy & Presser, P.C.

(57) ABSTRACT

An imaging apparatus has a color filter array, an image sensor, and a differential information acquisition unit. In the color filter array, including five or more types of color filters are arranged in a two dimensional form. The image sensor has a plurality of pixels covered by the color filters, and the plurality of pixels generate pixel signals. The acquisition unit designates one of the pixels covered by the color filters of interest as a pixel of interest one pixel at a time in order. The acquisition unit calculates first differential information based on pixel signals generated by two of the pixels arranged on both sides of the pixel of interest along the first direction. The acquisition unit calculates second differential information based on pixel signals generated by two of the pixels arranged on both sides of the pixel of interest along the second direction.

15 Claims, 42 Drawing Sheets

|     |     |     |     |     |     |     |     |     |
|-----|-----|-----|-----|-----|-----|-----|-----|-----|
| Or  | G   | R   | G   | Or  | G   | R   | G   | Or  |
| G   | B   | G   | Cy  | G   | B   | G   | Cy  | G   |
| R   | G   | Or  | G   | R   | G   | Or  | G   | R   |
| G   | Cy  | G   | B   | G   | Cy  | G   | B   | G   |
| Or  | G   | R   | G   | Or  | G   | R   | G   | Or  |
| G   | B   | G   | Cy  | G   | B   | G   | Cy  | G   |
| R   | G   | Or  | G   | R   | G   | Or  | G   | R   |
| G   | Cy  | G   | B   | G   | Cy  | G   | B   | G   |
| Or  | G   | R   | G   | Or  | G   | R   | G   | Or  | pb1 indicates the top-left 2×2 block (Or, G / G, B).

(a) G original image
signal components (b) Cy original image
signal components (c) Or original image
signal components (d) B original image
signal components (e) R original image
signal components

| G  | Cy | G  | R  | G  | Cy | G  | R  |
|----|----|----|----|----|----|----|----|
| B  | G  | Or | G  | B  | G  | Or | G  |
| G  | R  | G  | Cy | G  | R  | G  | Cy |
| Or | G  | B  | G  | Or | G  | B  | G  |
| G  | Cy | G  | R  | G  | Cy | G  | R  |
| B  | G  | Or | G  | B  | G  | Or | G  |
| G  | R  | G  | Cy | G  | R  | G  | Cy |
| Or | G  | B  | G  | Or | G  | B  | G  | px

| G | R | G | R | G | R | G | R |
|---|---|---|---|---|---|---|---|
| B | Or | B | Cy | B | Or | B | Cy |
| G | R | G | R | G | R | G | R |
| B | Cy | B | Or | B | Cy | B | Or |
| G | R | G | R | G | R | G | R |
| B | Or | B | Cy | B | Or | B | Cy |
| G | R | G | R | G | R | G | R |
| B | Cy | B | Or | B | Cy | B | Or | px

| G | R | G | Or | G | R | G | Or |
|---|---|---|----|---|---|---|----|
| B | G | Cy | G | B | G | Cy | G |
| G | R | G | Or | G | R | G | Or |
| B | G | Cy | G | B | G | Cy | G |
| G | R | G | Or | G | R | G | Or |
| B | G | Cy | G | B | G | Cy | G |
| G | R | G | Or | G | R | G | Or |
| B | G | Cy | G | B | G | Cy | G | px

| G | R | G | R | G | R | G | R |
|---|---|---|---|---|---|---|---|
| B | G | Or | G | B | G | Or | G |
| G | R | G | R | G | R | G | R |
| Cy | G | B | G | Cy | G | B | G |
| G | R | G | R | G | R | G | R |
| B | G | Or | G | B | G | Or | G |
| G | R | G | R | G | R | G | R |
| Cy | G | B | G | Cy | G | B | G | px

2103a

Column direction  Row direction

2105a u direction    v direction

| C4 | C1 | C4 | C6 | C4 | C1 | C4 | C6 |
| C3 | C4 | C5 | C4 | C3 | C4 | C5 | C4 |
| C4 | C7 | C4 | C2 | C4 | C7 | C4 | C2 |
| C5 | C4 | C3 | C4 | C5 | C4 | C3 | C4 |
| C4 | C1 | C4 | C6 | C4 | C1 | C4 | C6 |
| C3 | C4 | C5 | C4 | C3 | C4 | C5 | C4 |
| C4 | C7 | C4 | C2 | C4 | C7 | C4 | C2 |
| C5 | C4 | C3 | C4 | C5 | C4 | C3 | C4 | px

2110a

IMAGING APPARATUS WITH PLURAL COLOR FILTERS AND IMAGE PROCESSING

CROSS-REFERENCE TO RELATED APPLICATION

The present application is a Continuing Application based on International Application PCT/JP2012/003068 filed on May 10, 2012, which in turn, claims the priority from Japanese Patent Application No. 2011-106740 filed on May 11, 2011, the entire disclosure of which is incorporated herein by reference.

TECHNICAL FIELD

The present invention relates to an imaging apparatus that realizes improvement of color reproducibility and acquisition of the gradient information (differential information) used for various image processing at a high accuracy as well.

BACKGROUND OF THE INVENTION

There is known an imaging apparatus including an image sensor provided with a three-color (RGB) filter for capturing full-color images. It is known that the gradient information of images is acquired to detect various information from the captured images and to perform various processing of the images. In the conventional imaging apparatus, the number of bands of color filter is small, thus the sample density of image signal components corresponding to each band is relatively high, and the accuracy of the gradient information based on interpolation images produced by color interpolation is sufficiently high.

To provide a faithful color reproduction of an object, a multiband imaging has received an attention. For multiband imaging, photographing with a plurality of cameras or several times of photographing may be performed. However, for such a multiband imaging, a dedicated photographing system has been needed. Thus, there has been suggested that, by using a single-chip multiband image sensor where color filters of four or more bands are arranged, a multiband imaging is performed by taking one photograph with one imaging apparatus (see Patent Literature 1).

CITATION LIST

Patent Literature

Patent Literature 1: JP 2003-087806 A

SUMMARY OF THE INVENTION

In Patent Literature 1, a multiband color filter array (CFA) is used. However, as the number of bands increases, the sample density of a single band decreases. When the sample density of a single band decreases, acquisition of the gradient information in a common direction becomes difficult, resulting in complicated processing and reduction in accuracy of the gradient information such as, for example, loss of the high frequency component information due to conversion for matching the directions of the gradient information. Reduction in the accuracy of the gradient information affects the subsequent processes, and may result in, for example, generation of false colors.

In view of the above problems, it is therefore an object of the present invention to provide an imaging apparatus that realizes multiband imaging and acquires gradient information using color filters (pixels) arranged on both sides of color filters serving as references, where at least two types of color filters are designated as the reference color filters thereby allowing for acquisition of gradient information of at least two common directions.

In order to solve the above-described problem, the imaging apparatus according to the present invention is an imaging apparatus comprising: a color filter array including five or more types of color filters having different spectral sensitivity characteristics, with at least two types of color filters among the five or more types of the color filters being designated as color filters of interest, the five or more color filters being arranged in a two dimensional form such that two of the color filters arranged on both sides of each of the color filters of interest at a first interval along a first direction are of the same type, and two of the color filters arranged at a second interval on both sides of the color filter of interest along a second direction different from the first direction are of the same type; an image sensor having a plurality of pixels covered by the color filters of any type in the color filter array, the plurality of pixels generating pixel signals in accordance with the quantity of received light; and a differential information acquisition unit that designates the pixels covered by the type of the color filters serving as the color filters of interest provided on the color filter array as a pixel of interest one pixel at a time in order, calculates first differential information based on pixel signals generated by two of the pixels arranged on both sides of the pixel of interest at the first interval along the first direction, and calculates second differential information based on pixel signals generated by two of the pixels arranged on both sides of the pixel of interest at the second interval along the second direction.

With an imaging apparatus having the structure described above, in attempts to realize multiband color filters, when gradient information is acquired using color filters (pixels) arranged on both sides of color filters serving as references, at least two types of color filters are designated as the reference color filters, so that highly accurate gradient information of at least two common directions can be acquired.

BRIEF DESCRIPTION OF DRAWINGS

FIG. 4 is an array diagram of pixels, showing the structure of first pixel blocks.

FIG. 5 is an array diagram of color filters in the first pixel blocks assuming that the type of the color filter of a pixel in the center of each first pixel block is the type of the color filter of the relevant first pixel block.

FIG. 6 is an array diagram of pixels, showing an arrangement of second pixel blocks.

FIG. 8 is an array diagram of pixels, showing an arrangement of third pixel blocks.

FIG. 11 is a diagram for illustrating original image signal components of G, Cy, Or, B, and R.

FIG. 14 is an array diagram of a color filter array having five-band color filters according to a first modification.

FIG. 15 is an array diagram illustrating the structure of a color filter array having five-band color filters according to a second modification.

FIG. 16 is an array diagram of pixels, illustrating the structure of first pixel blocks in the color filter arrangement of FIG. 15.

FIG. 17 is an array diagram of pixels, illustrating the structure of second pixel blocks in the color filter arrangement of FIG. 15.

FIG. 18 is an array diagram showing the structure of a color filter array having five-band color filters according to a third modification.

FIG. 19 is an array diagram showing the structure of a color filter array having five-band color filters according to a fourth modification.

DESCRIPTION OF EMBODIMENTS

Figure 1:
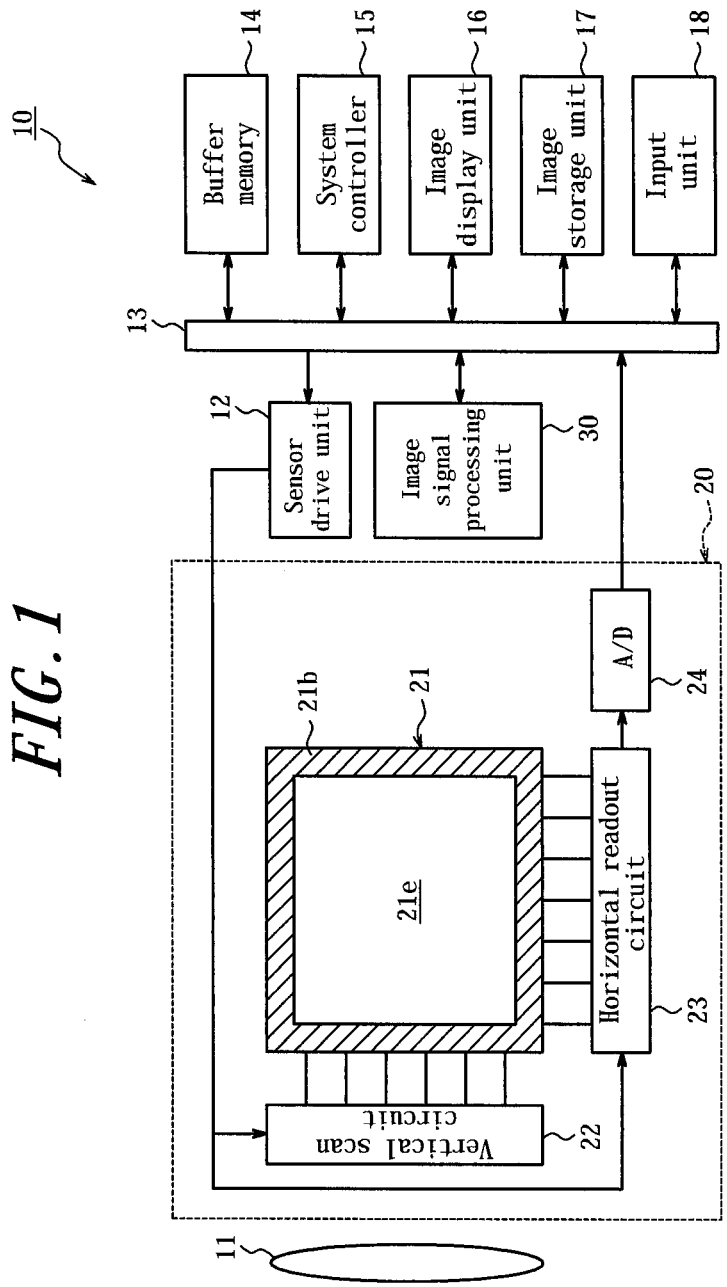
FIG. 1 is a block diagram schematically illustrating the structure of a digital camera having an image sensor provided with a color filter array according to one embodiment of the present invention.

With reference to the drawings, the following describes embodiments of the present invention. FIG. 1 is a block diagram schematically illustrating a digital camera provided with an image sensor including color filters according to one embodiment of the present invention.

A digital camera 10 includes an imaging optical system 11, an image sensor 20, a sensor drive unit 12, a system bus 13, an image signal processing unit 30, a buffer memory 14, a system controller 15, an image display unit 16, an image storage unit 17, an input unit 18, and the like.

The imaging optical system 11 is positioned vertically so that the light axes thereof traverse the center of a light receiving unit 21 in the image sensor 20 and unite on the image sensor 20. The imaging optical system 11 comprises a plurality of lenses (not illustrated) and images an optical image of a subject on the light receiving unit 21. Note that the imaging optical system 11 may be fixed to the digital camera 10, or may be detachably interchangeable therefrom.

The image sensor 20 is, for example, a CMOS area sensor and includes the light receiving unit 21, a vertical scan circuit 22, a horizontal readout circuit 23, and an A/D converter 24. As described above, an optical image of a subject is formed by the imaging optical system 11 on the light receiving unit 21.

A plurality of pixels (not illustrated) are arranged in a matrix on the light receiving unit 21. Furthermore, on the light receiving unit 21, an optical black (OB) region 21b and an active imaging region 21e are established. The light-receiving surface of OB pixels positioned in the OB region 21b is shielded from light, and these OB pixels output dark current as an OB pixel signal serving as a standard for the color black. The active imaging region 21e is covered by a CFA (not illustrated in FIG. 1), and each pixel is covered by one of five-band color filters.

Figure 2:
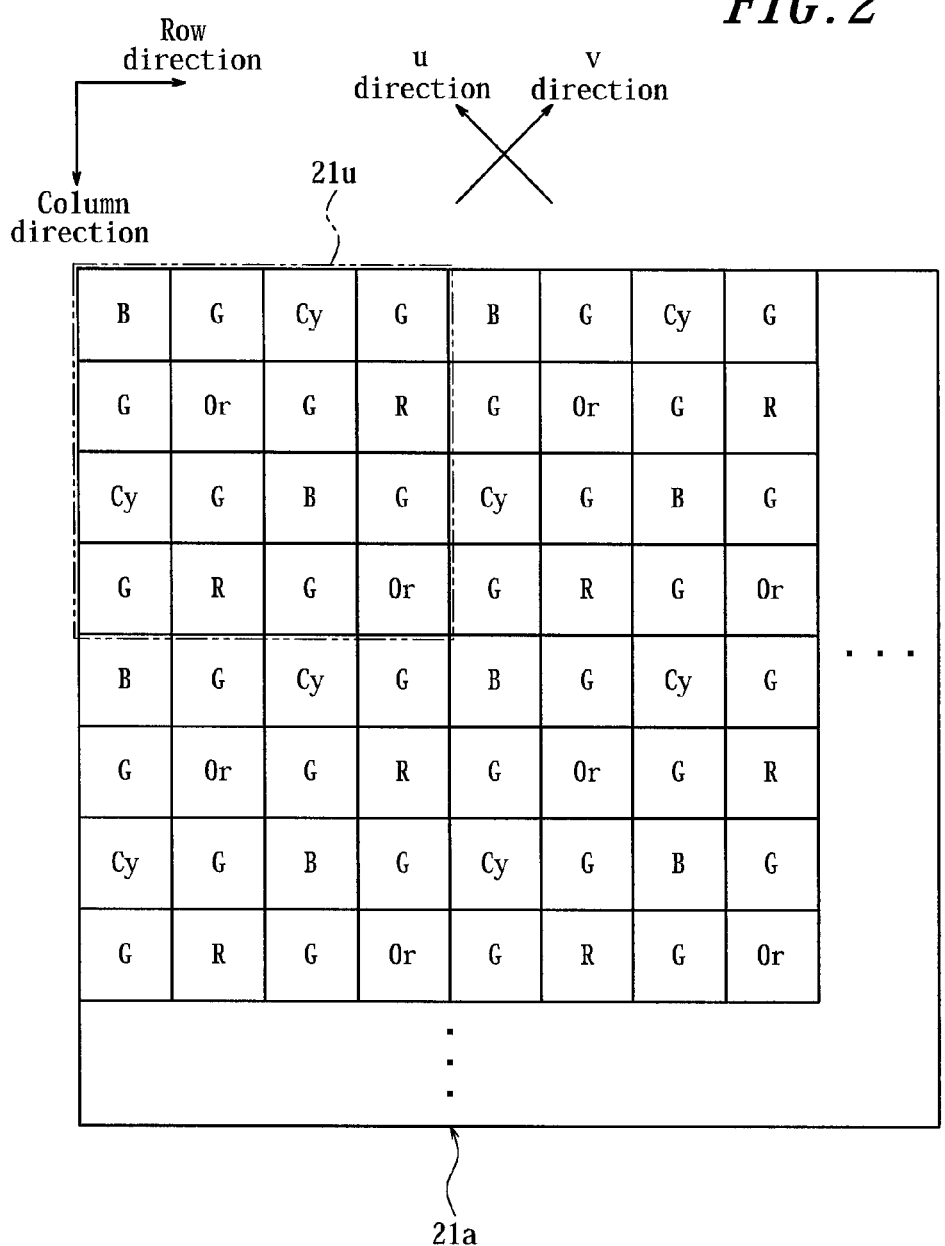
FIG. 2 is an array diagram showing an arrangement of color filters in a CFA.
Figure 3:
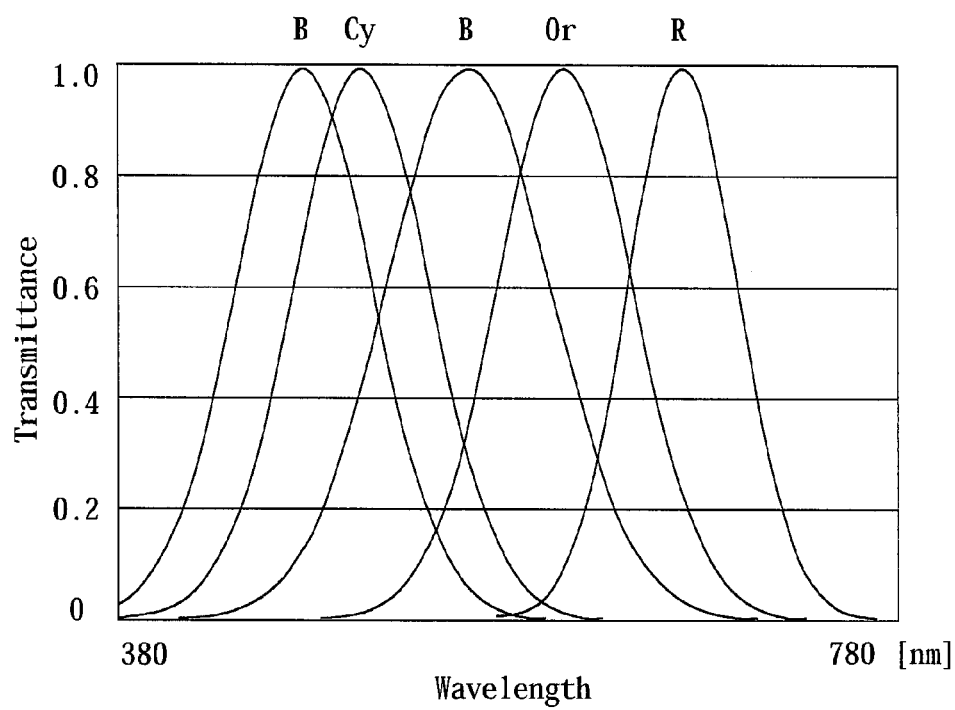
FIG. 3 shows spectral sensitivity characteristics of the color filters in FIG. 2.

As shown in FIG. 2, a CFA 21a is provided with five-band color filters: a G (green) color filter, a Cy (cyan) color filter, Or (orange) color filter, a B (blue) color filter, and an R (red) color filter. Accordingly, in each pixel, a pixel signal is generated in correspondence with the amount of received light passing through the band of the corresponding color filter. Note that as shown in FIG. 3, the color filters of G, Cy, Or, B, and R have different spectral sensitivity characteristics. Further, in this embodiment, different spectral sensitivity characteristics mean different peak wavelength values or different central values of the half widths.

In the CFA 21a, a 4×4 color filter repetition unit 21u is repeatedly placed in the row direction and the column direction. As illustrated in FIG. 2, eight G color filters, two Cy color filters, two Or color filters, two B color filters, and two R color filters are placed in the color filter repetition unit 21u.

In the CFA 21a, the Cy color filters, the Or color filters, the B color filters, and the R color filters are positioned in a checkerboard pattern with the G color filters. In other words, the G color filters are repeatedly provided in every other pixel of every row and column. For example, staring from the upper-left corner of FIG. 2, G color filters are provided in columns 2 and 4 of rows 1 and 3. Furthermore, G color filters are provided in columns 1 and 3 of rows 2 and 4.

The rows and columns containing the G color filters, B color filters, and Cy color filters repeatedly occur every other pixel in the column direction and the row direction. For example, in FIG. 2, B color filters are provided in row 1, column 1 and in row 3, column 3, whereas Cy color filters are provided in row 1, column 3 and in row 3, column 1.

The rows and columns containing the G color filters, R color filters, and Or color filters also repeatedly occur every other pixel in the column direction and the row direction. For example, in FIG. 2, R color filters are provided in row 2, column 4 and in row 4, column 2, whereas Or color filters are provided in row 2, column 2 and in row 4, column 4.

In the above-described color filter repetition unit 21u, the proportion of G color filters is the largest, accounting for 50% of the total. For any pixel, the bands of the color filters corresponding to the diagonally adjacent pixels are the same.

For example, as shown in FIG. 2, for any of the G color filters, the diagonally adjacent color filters are all G color filters. Accordingly, diagonally to the upper right and the lower left of any G color filter, G color filters of the same band are provided. G color filters of the same band are also provided diagonally to the lower right and the upper left.

Each of the Cy color filters is interposed diagonally between R color filters and Or color filters. In greater detail, diagonally to the upper right and the lower left of any Cy color filter, Or color filters of the same band are provided. R color filters of the same band are also provided diagonally to the lower right and the upper left.

The Or color filters, B color filters, and R color filters are all similar, with diagonally adjacent color filters being color filters of the same band.

In a pixel provided with the above-described CFA 21a, pixel signals are generated in correspondence with the amount of received light passing through the band. The row of the pixel caused to output a pixel signal is selected by the vertical scan circuit 22, and the column of the pixel caused to output a pixel signal is selected by the horizontal readout circuit 23 (see FIG. 1).

The vertical scan circuit 22 and the horizontal readout circuit 23 are driven by the sensor drive unit 12. The digital camera 10 is provided with normal readout mode and first to third thinning readout modes. In each mode, the vertical scan circuit 22 and the horizontal readout circuit 23 are controlled so that a pixel signal is output from one pixel at a time from all the pixels to be subjected to readout. The output pixel signal is converted into a digital signal by the A/D converter 24. The pixel signals of every pixel provided in the light receiving unit 21 are set as RAW data for one frame.

Note that when high resolution is required, for example when capturing a still image, the image sensor 20 is operated in normal readout mode to generate a pixel signal from every pixel. Further, when detecting information for light modulation and focusing operations in a standby state for imaging, and when high dynamic resolution is required, for example when capturing moving pictures, the image sensor 20 is operated in the first to third thinning readout modes.

Figure 4:
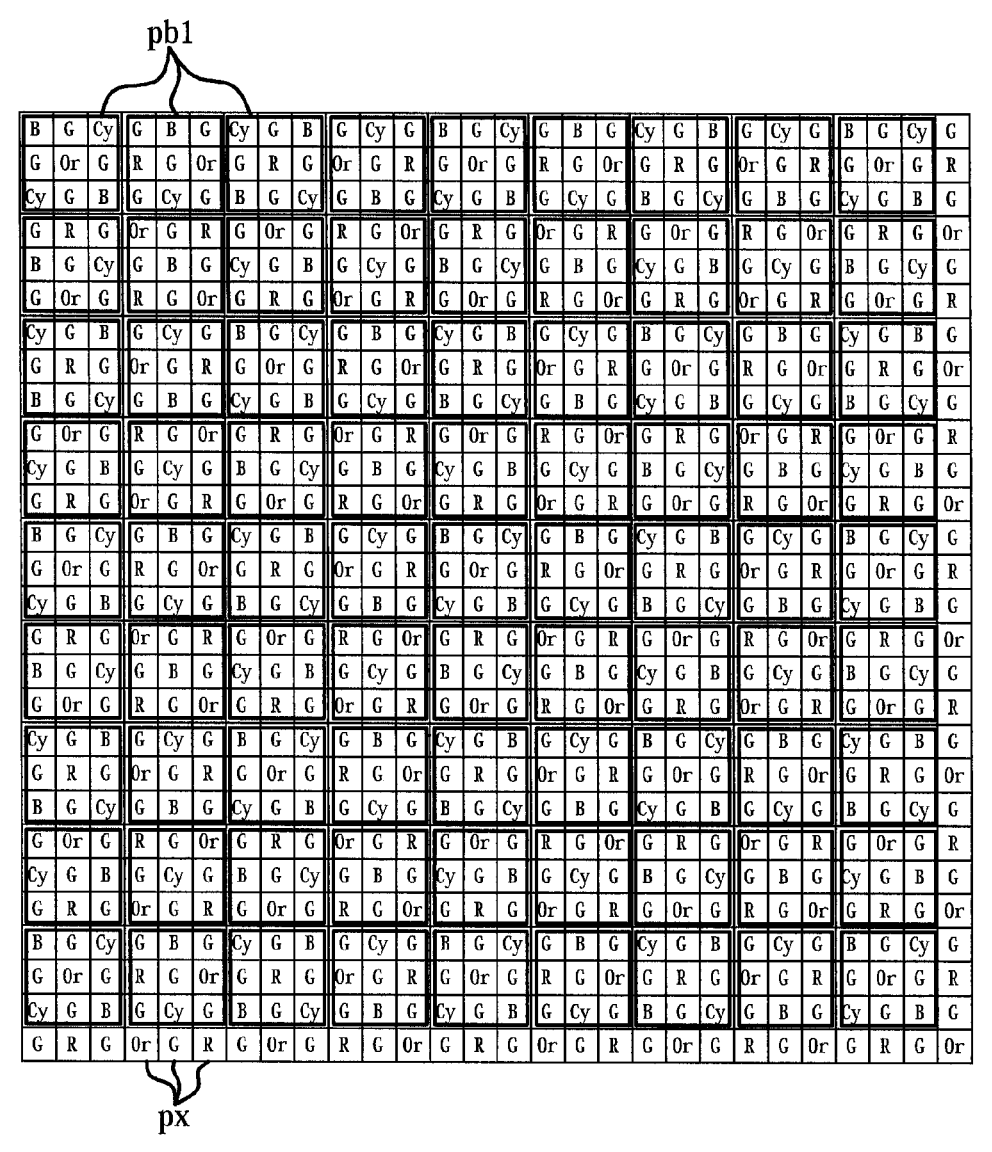

In the first thinning readout mode, as shown in FIG. 4, in each of the first pixel blocks pb1 each including pixels px arranged in three rows and three columns, only a pixel px in the center of the first pixel block pb1 outputs a pixel signal.

Note that when the color signal component of the pixel signal output by a first pixel block pb1 is regarded as the type of a color filter of the first pixel block pb1, as shown in FIG. 5, the arrangement of the color filters in the first pixel block pb1 is the same as the arrangement of the color filters in the CFA 21a. Accordingly, original image signals output in the first thinning readout mode can be subjected to the same image processing as the original image signals output in the normal readout mode by the image signal processing unit 30.

Figure 6:
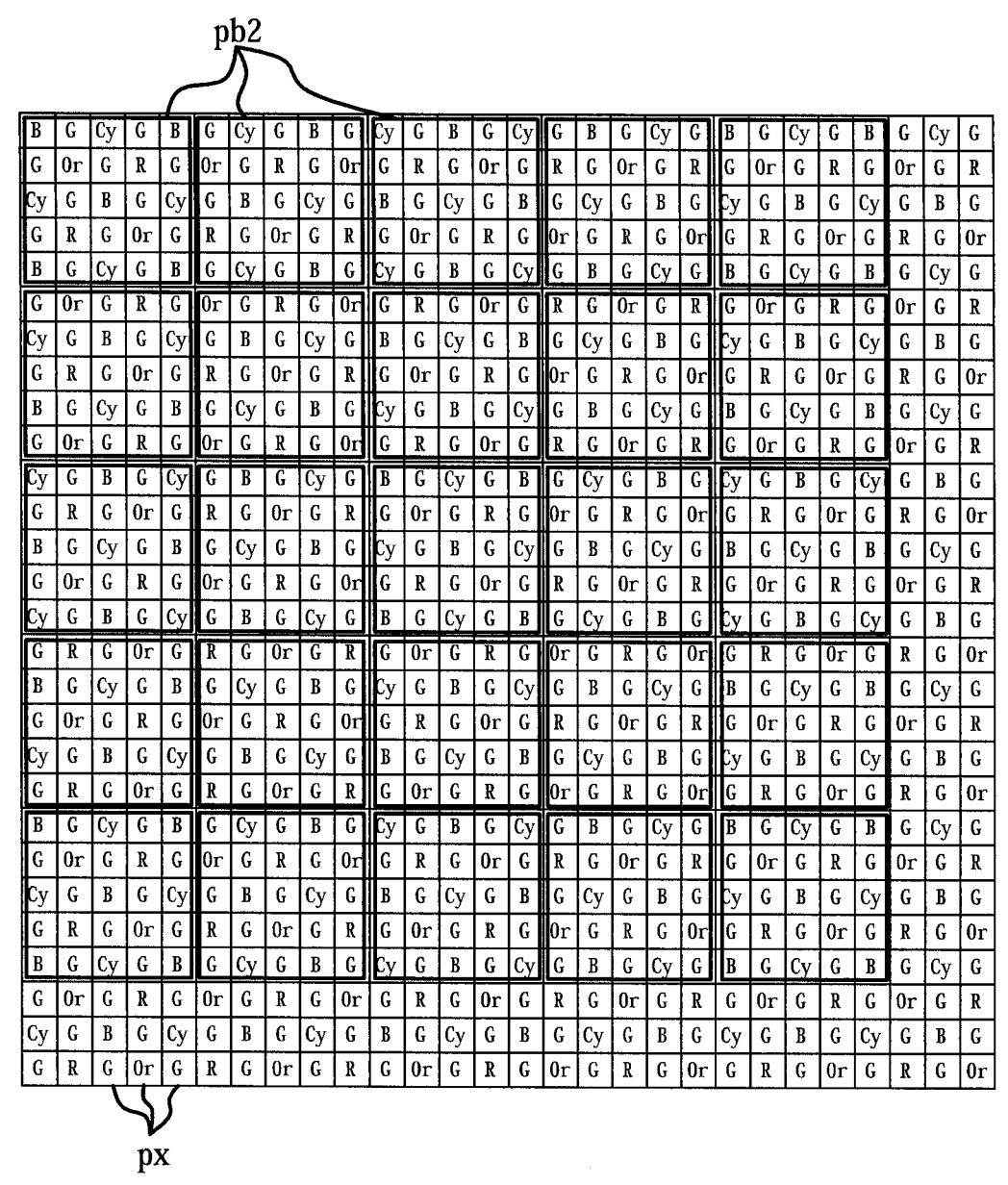

In the second thinning readout mode, as shown in FIG. 6, in each of second pixel blocks pb2 each including pixels px arranged in five rows and five columns, only a pixel px in the center of the second pixel block pb2 outputs a pixel signal.

Figure 7:
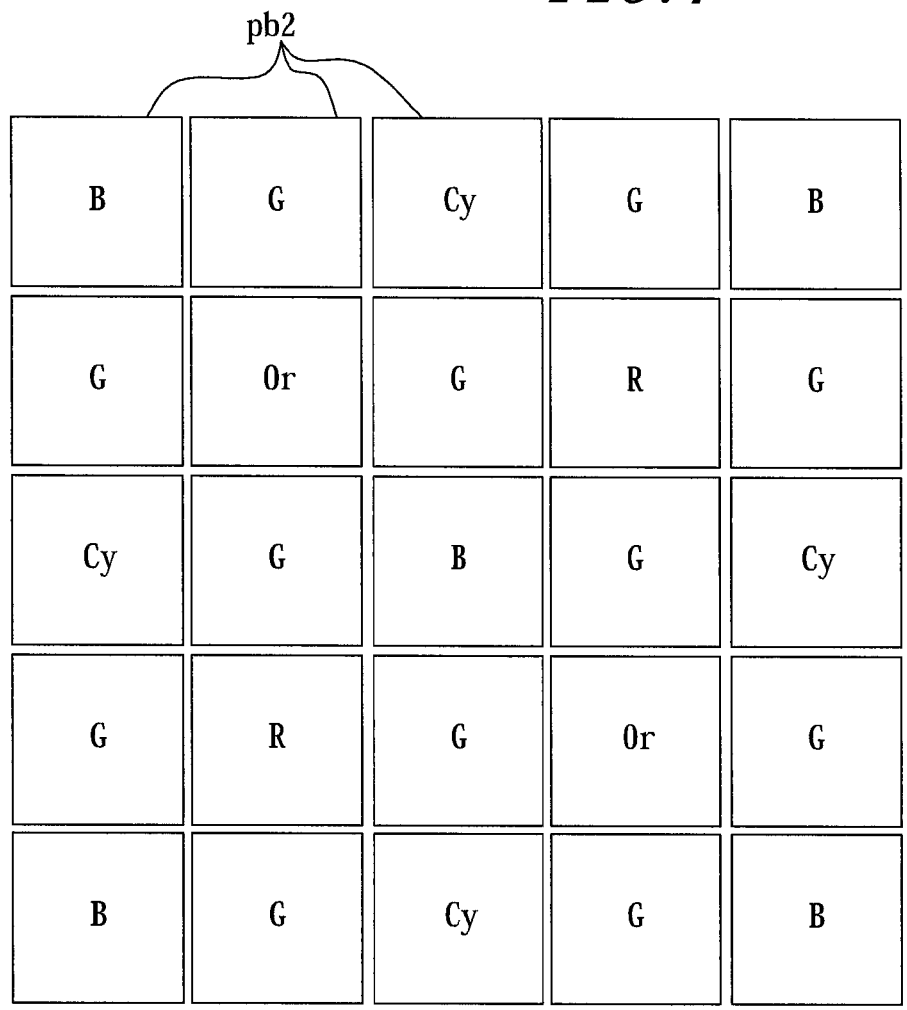
FIG. 7 is an array diagram of color filters in the second pixel blocks assuming that the type of the color filter of a pixel in the center of each second pixel block is the type of the color filter of the relevant second pixel block.

Note that when the color signal component of the pixel signal output by a second pixel block pb2 is regarded as the type of a color filter of the second pixel block pb2, as shown in FIG. 7, the arrangement of the color filters in the second pixel block pb2 is the same as the arrangement of the color filters in the CFA 21a. Accordingly, original image signals output in the second thinning readout mode can be subjected to the same image processing as the original image signals output in the normal readout mode by the image signal processing unit 30.

Figure 8:
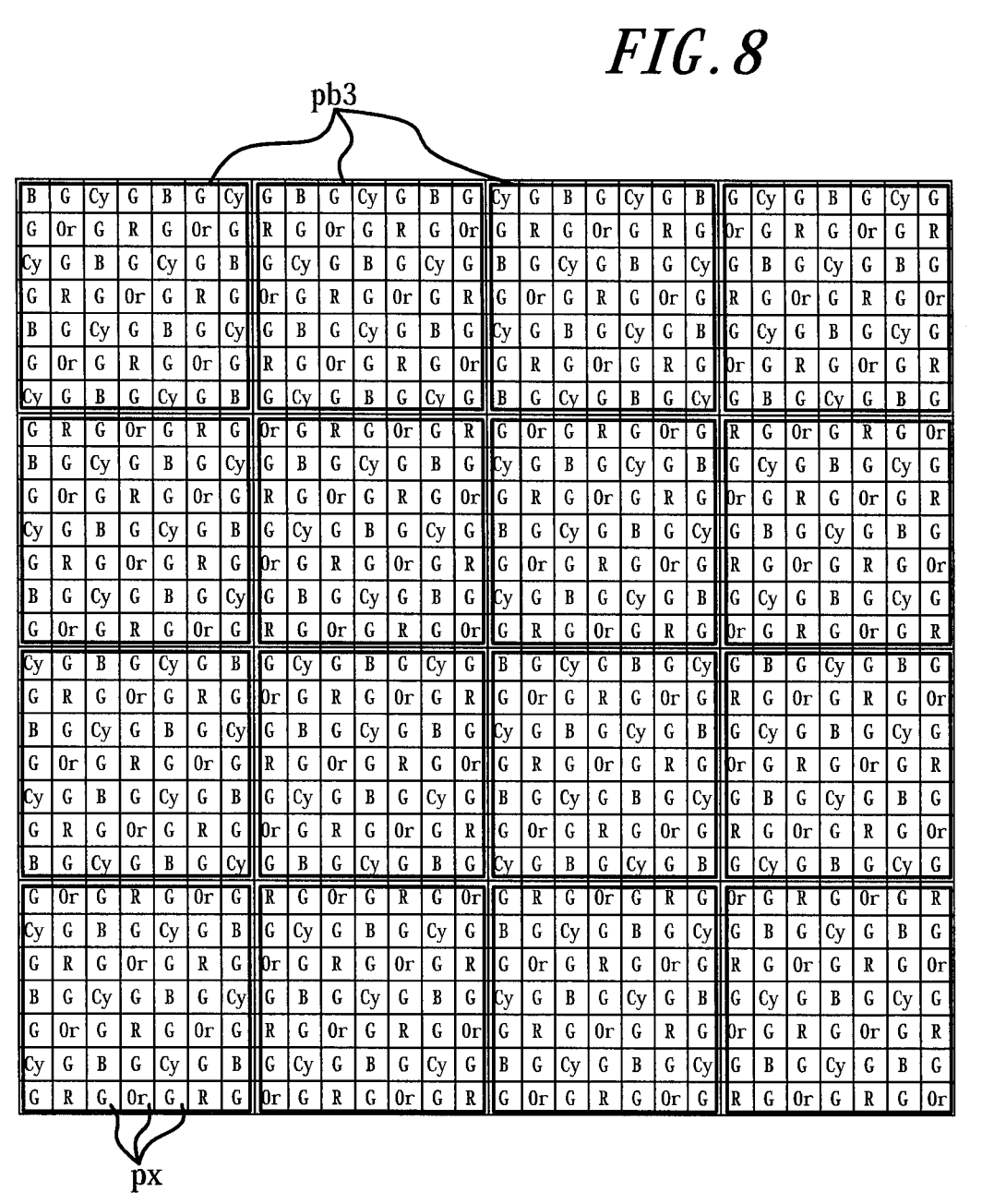

In the third thinning readout mode, as shown in FIG. 8, in each of third pixel blocks pb3 including pixels px arranged in seven rows and seven columns, only a pixel px in the center of the third pixel block pb3 outputs a pixel signal.

Figure 9:
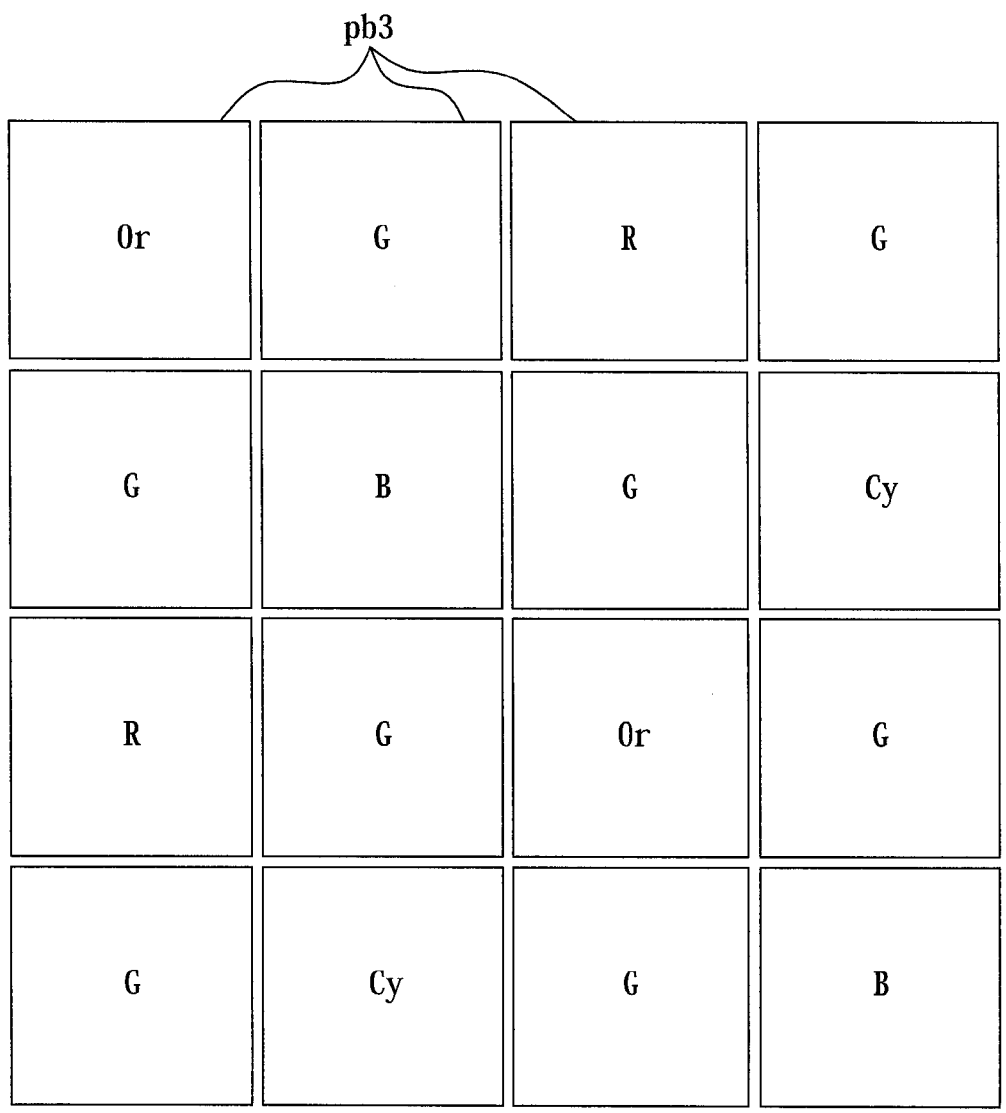
FIG. 9 is an array diagram of color filters in third pixel blocks assuming that the type of the color filter of a pixel in the center of each third pixel block is the type of the color filter of the relevant third pixel block.

Note that when the color signal component of the pixel signal output by a third pixel block pb3 is regarded as the type of a color filter of the third pixel block pb3, as shown in FIG. 9, the arrangement of the color filters in the third pixel block pb3 is the same as the arrangement of the color filters in the CFA 21a. Accordingly, original image signals output in the third thinning readout mode can be subjected to the same image processing as the original image signals output in the normal readout mode by the image signal processing unit 30.

It should be noted that as a pixel block grows in size, in other words, as the number of pixels included in a pixel block is increased, the resolution decreases while the readout speed is increased. Therefore, one of the first to third thinning readout modes is selected in accordance with the required readout speed or resolution.

The image sensor 20, buffer memory 14, image signal processing unit 30, system controller 15, image display unit 16, image storage unit 17, input unit 18, and sensor drive unit 12 are electrically connected via the system bus 13 (see FIG. 1). These components connected to the system bus 13 can transmit and receive a variety of signals and data to and from each other over the system bus 13.

The original image signal output from the image sensor 20 is transmitted to the buffer memory 14 and stored. The buffer memory 14 is an SDRAM or the like with a relatively high access speed and is used as a work area for the image signal processing unit 30. The buffer memory 14 is also used as a work area when the system controller 15 executes a program to control the units of the digital camera 10.

The image signal processing unit 30 performs demosaicing, described in detail below, on an original image signal to generate an interpolated image signal. Furthermore, the image signal processing unit 30 performs predetermined image processing on the interpolated image signal. Note that as necessary, the interpolated image signal is converted into an RGB image signal.

The interpolated image signal and RGB image signal on which predetermined image processing has been performed are transmitted to the image display unit 16. The image display unit 16 includes a multiple primary color monitor (not illustrated in FIG. 1) and an RGB monitor (not illustrated in FIG. 1). The multiple primary color monitor and the RGB monitor are provided with a color liquid crystal display element (not shown) and a back light device (not shown), and display images corresponding to the interpolated image signal and RGB image signal on the multiple primary color monitor and the RGB monitor.

Note that the image display unit 16 is provided on the back or side of the digital camera 10. Further, the image display unit 16 may be an EVF (electronic viewfinder) composed of a relatively small display element (not shown) and a magnification optical system (not shown). Moreover, the image display unit 16 may combine both of those forms, and may be configured to switch the forms depending on the conditions of use. Alternatively, the image display unit 16 may be an organic EL display element or the like.

The interpolation image signal and RGB image signal output from the image signal processing unit 30 are also transmitted to the image storage unit 17 and stored. Note that the image storage unit 17 is a flash memory which is built-in type or connectable via a connector (not shown).

The units of the digital camera 10 are controlled by the system controller 15. Control signals for controlling the units are input from the system controller 15 to the units via the system bus 13.

Note that the image signal processing unit 30 and the system controller 15 can be configured as software executing on an appropriate processor, such as a central processing unit (CPU), or configured as a dedicated processor specific to each process.

The system controller 15 is connected to an input unit 18 having an input mechanism including a power button (not illustrated), a release button (not illustrated), a dial (not illustrated), and the like. A variety of operation input for the digital camera 10 from the user is detected by the input unit 18. In accordance with the operation input detected by the input unit 18, the system controller 15 controls the units of the digital camera 10.

Next, the structure of the image signal processing unit 30 is described with reference to FIG. 10. The image signal processing unit 30 comprises an OB subtraction unit 31, a multiband (MB) demosaicing unit 40 (image processing system), an NR processing unit 32, an MB-RGB conversion unit 33, a color conversion unit 34, and a color/gamma correction unit 35.

The original image signal output from the buffer memory 14 is transmitted to the OB subtraction unit 31. In the OB subtraction unit 31, the black level of each pixel signal is adjusted by subtracting the OB pixel signal generated in the OB pixel from each pixel signal.

The pixel signal output from the OB subtraction unit 31 is transmitted to the MB demosaicing unit 40. As described above, the pixel signal forming the original image signal only includes one color signal component among the five bands. In other words, as illustrated in FIG. 11, the original image signal is formed by a G original image signal component (see (a)), a Cy original image signal component (see (b)), an Or original image signal component (see (c)), a B original image signal component (see (d)), and an R original image signal component (see (e)). As described below, all color signal components are interpolated through the demosaicing by the MB demosaicing unit 40. Specifically, all pixel signals are interpolated so as to include five color signal components.

Figure 10:
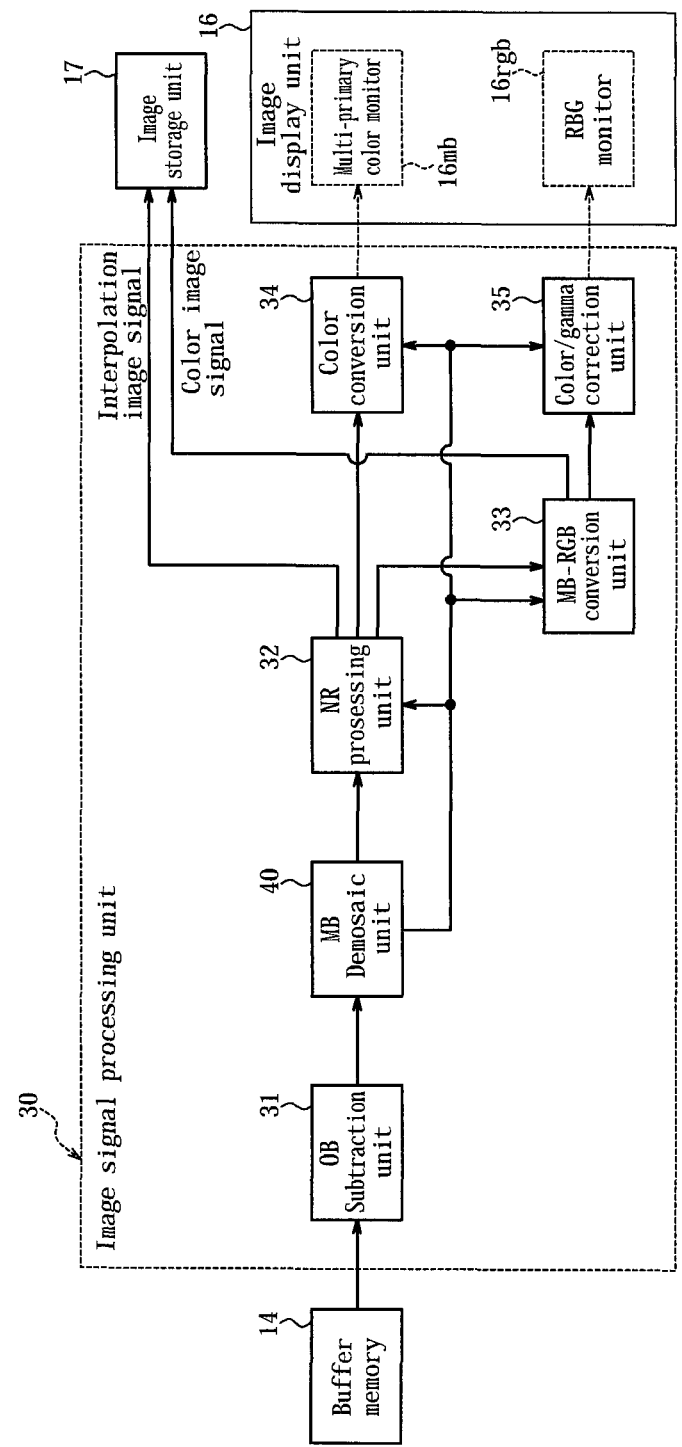
FIG. 10 is a block diagram schematically showing the structure of an image signal processing unit.

The original image signal on which demosaicing has been performed is transmitted to the NR processing unit 32 as an interpolation image signal (see FIG. 10). The NR processing unit 32 performs noise reduction such as coring or median filtering to remove noise from the interpolation image signal. The interpolation image signal with noise being removed is temporarily stored in the buffer memory 14.

When the digital camera 10 is set to recording mode for recording interpolation image signals, the interpolation image signal stored in the buffer memory 14 is compressed as necessary to be stored as an interpolated image file created depending on a predetermined format in the image storage unit 17.

Note that color reproduction information to be referred to when an image is reproduced later is added as tag information to the interpolated image file. Note that the color reproduction information includes spectral transmittance of the imaging optical system 11, spectral sensitivity of the image sensor 20, spectral radiance of light illuminating an object in image capturing, statistical information specific to the object, which is referred to for a process of estimating the spectral reflectance of the object, and the like.

When the operation mode of the digital camera 10 is set to image reproduction mode for reproducing a multiband image, the interpolation image signal with noise being removed by the NR processing unit 32 is transmitted to the color conversion unit 34.

The color conversion unit 34 previously acquires information on the monitor profile of a multi-primary color monitor 16*mb* or the like (monitor profile information). Further, the color conversion unit 34 acquires information on the spectral radiance of ambient illumination light around the digital camera 10 (observation light spectral distribution information) from an optical sensor (not shown) provided in the vicinity of the multi-primary color monitor 16*mb*. The color conversion unit 34 performs color conversion on the interpolation image signal using monitor profile information and observation light spectral distribution information. The interpolation image signal on which color conversion has been performed is transmitted to the multi-primary color monitor 16*mb*.

The object is displayed with such coloring as under exposure to ambient illumination light around the digital camera 10, on the multi-primary color monitor 16*mb* by the above-mentioned color conversion processing. Thus, the user can observe an image with improved reproducibility.

The digital camera 10 can store and display RGB image signal containing only conventional RGB as color signal components. When the digital camera 10 is set to recording mode for storing RGB image signals, the interpolation image signal with noise being removed is transmitted to the MB-RGB conversion unit 33.

In the MB-RGB conversion unit 33, RGB conversion is performed on the interpolated image signal. The interpolated image signal formed from color signal components in five bands is converted to an RGB image signal formed from color signal components in the three RGB bands. The RGB image signal is temporarily stored in the buffer memory 14, and is compressed as necessary to be stored as an RGB image file created depending on a predetermined format in the image storage unit 17.

When the digital camera 10 is set to image reproduction mode for reproducing 3 band RGB images, the RGB image signal is transmitted to the color/gamma correction unit 35. The color/gamma correction unit 35 previously acquires the monitor profile of an RGB monitor 16rgb. In the color/gamma correction unit 35, color correction and gamma correction are performed on the RGB image signal using the acquired monitor profile. The RGB image signal on which these corrections have been performed is transmitted to the RGB monitor 16rgb, and an image corresponding to the RGB image signal is displayed.

Next, demosaicing is described with reference to FIG. 12, which is a conceptual diagram illustrating demosaicing performed by the MB demosaicing unit 40.

As described above, in an original image signal OIS, each pixel signal only includes one color signal component among the five bands. The original image signal OIS is divided into a G original image signal component gOIS, a Cy original image signal component cyOIS, an Or original image signal component orOIS, a B original image signal component bOIS, and an R original image signal component rOIS.

Figure 12:
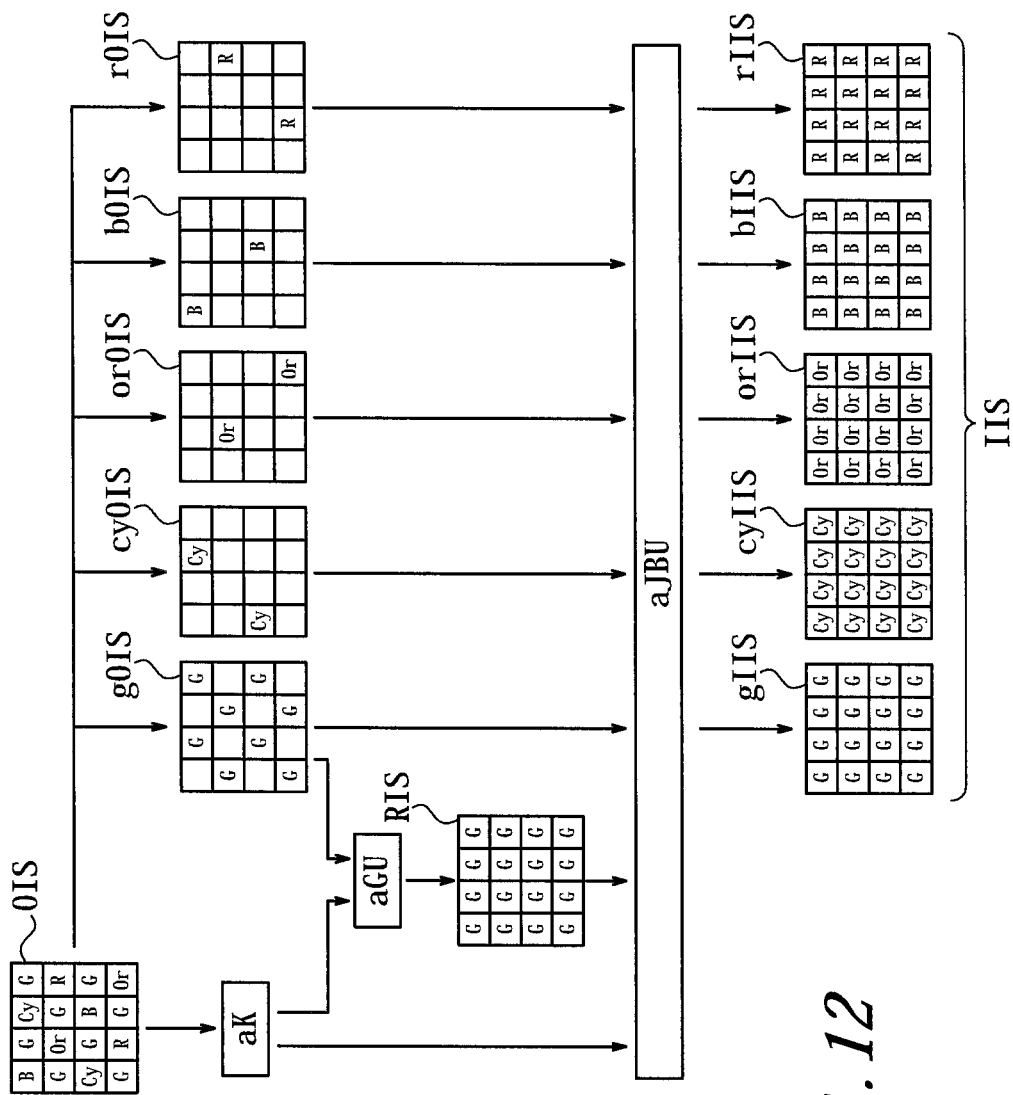
FIG. 12 is a schematic diagram for illustrating demosaicing performed by an MB demosaicing unit.

Using all pixel signals in the original image signal OIS, an adaptive kernel function is calculated for every pixel (see "aK" in FIG. 12). Using the adaptive kernel function and the G original image signal component gOIS, the pixel signals that are missing in the G original image signal component gOIS are interpolated with an adaptive Gaussian interpolation method (see "aGU" in FIG. 12), so that a reference image signal RIS (primary reference image) is generated.

Using the adaptive kernel function, the reference image signal RIS, and the G original image signal component gOIS, missing pixel signals in the G original image signal component gOIS are interpolated with an adaptive joint bilateral interpolation method (see "aJBU" in FIG. 12), so that a G interpolated image signal component gIIS is generated.

Similar processing is performed using the Cy original image signal component cyOIS instead of the G original image signal component gOIS, so that a Cy interpolated image signal component cyIIS is generated. Similarly, an Or interpolated image signal component orIIS, a B interpolated image signal component bIIS, and an R interpolated image signal component rIIS are generated. By generating pixel signals having all color signal components for all pixels, an interpolated image signal IIS is generated.

Figure 13:
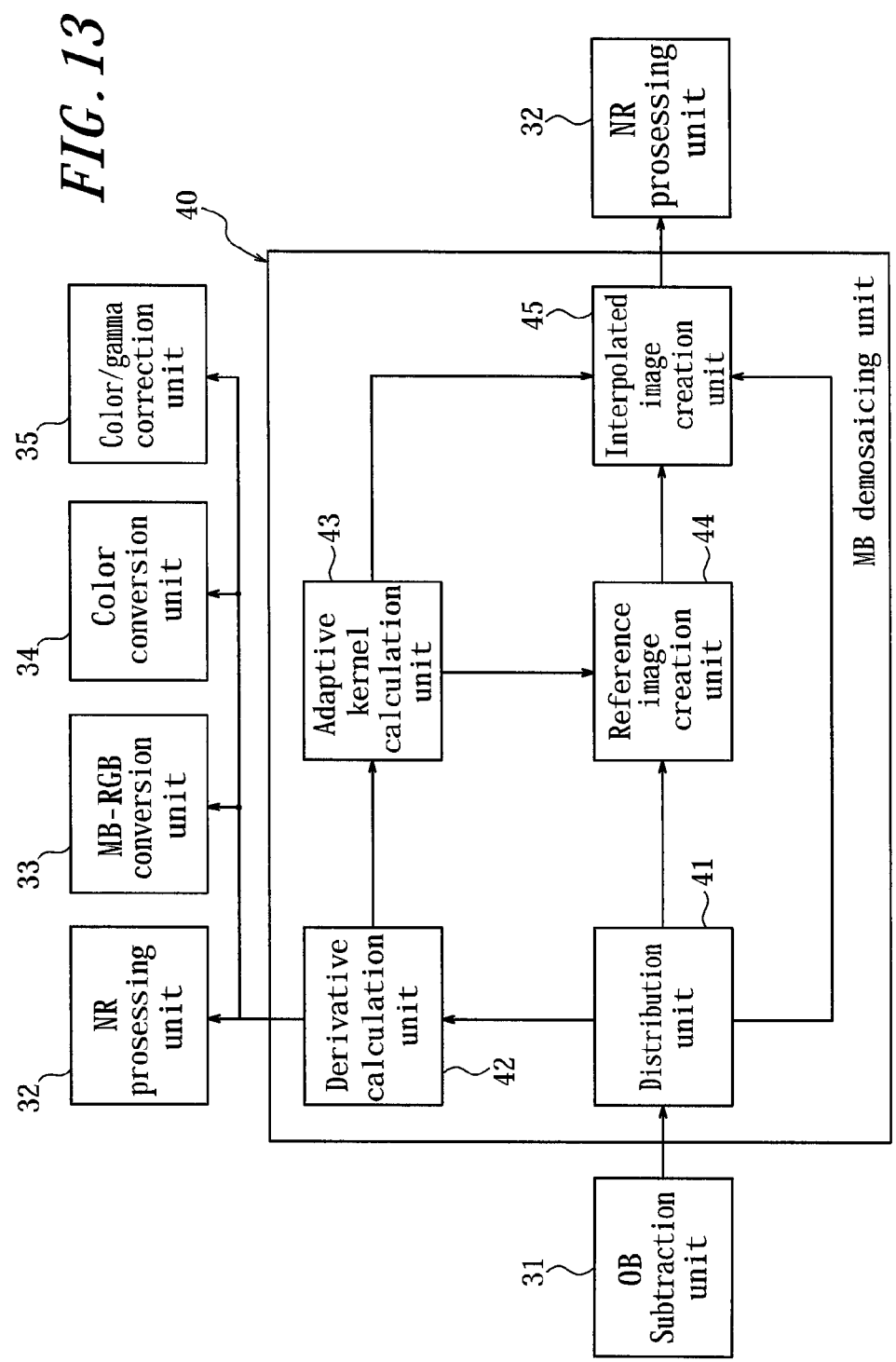
FIG. 13 is a block diagram schematically showing the structure of the MB demosaicing unit.

Next, the structure and functions of the MB demosaicing unit 40 that performs such demosaicing is described with reference to FIG. 13. The MB demosaicing unit 40 comprises a distribution unit 41, a derivative calculation unit 42, an adaptive kernel calculation unit 43, a reference image creation unit 44, and an interpolated image creation unit 45.

The original image signal received by the MB demosaicing unit 40 is input into the distribution unit 41. In the distribution unit 41, color signal components are distributed to the derivative calculation unit 42, reference image creation unit 44, and interpolated image creation unit 45 as necessary.

All pixel signals forming the original image signal are transmitted to the derivative calculation unit 42. In the derivative calculation unit 42, derivatives in two directions (derivative information) are calculated for each pixel. In order to calculate the derivatives, each of the pixels is designated in order as a pixel of interest. The difference between the pixel signals for the pixels adjacent to the designated pixel of interest to the upper right and the lower left and the difference between the pixel signals for the pixels adjacent to the designated pixel of interest to the lower right and the upper left are calculated as the derivatives.

Note that, as described above, for any pixel that is the pixel of interest, the pixel signals generated in the pixels to the upper right and the lower left are for the same color signal component, and the pixel signals generated in the pixels to the lower right and the upper left are for the same color signal component. Therefore, the above derivatives indicate the local pixel gradient in the diagonal directions centering on the pixel of interest. The derivatives calculated for all pixels are transmitted to the adaptive kernel calculation unit 43.

Note that the derivatives calculated for all pixels are transmitted not only to the adaptive kernel calculation unit 43 but also to the NR processing unit 32, the MB-RGB conversion unit 33, the color conversion unit 34, and the color/gamma correction unit 35. The derivatives are used for processing operations of respective units.

Based on the derivatives, the adaptive kernel calculation unit 43 calculates an adaptive kernel function for each pixel. In order to calculate the adaptive kernel function, each of the pixels is designated in order as a pixel of interest. Pixels in a 7×7 region around the pixel of interest are designated as surrounding pixels. Once the pixel of interest and the surrounding pixels have been designated, the inverse matrix of a covariance matrix $C_x$ is calculated for the pixel of interest.

The inverse matrix is calculated by substituting the derivatives of the pixel of interest and of the surrounding pixels into Equation (1).

$$C_x^{-1} = \frac{1}{|N_x|} \begin{pmatrix} \sum_{x_j \in N_x} z_u(x_j)z_u(x_j) & \sum_{x_j \in N_x} z_u(x_j)z_v(x_j) \\ \sum_{x_j \in N_x} z_u(x_j)z_v(x_j) & \sum_{x_j \in N_x} z_v(x_j)z_v(x_j) \end{pmatrix} \quad (1)$$

In Equation (1), $N_x$ is a pixel position set for the surrounding pixels, and $|N_x|$ is the number of pixels in the pixel position set. Furthermore, $z_u(x_j)$ is the derivative of surrounding pixel $x_j$ in the u direction, and $z_v(x_j)$ is the derivative of surrounding pixel $x_j$ in the v direction. Note that as illustrated in FIG. 2, the u direction is the direction from the lower right to the upper left, and the v direction is the direction from the lower left to the upper right.

Once the covariance matrix for the pixel of interest is calculated, a parameter $\mu_x$ representing the magnitude of the kernel function for the pixel of interest is then calculated. In order to calculate the parameter $\mu_x$, eigenvalues $\lambda_1$ and $\lambda_2$ for the covariance matrix $C_x$ are calculated. The product of the eigenvalues $\lambda_1 \times \lambda_2$ is compared with a threshold S. If the product of the eigenvalues $\lambda_1 \times \lambda_2$ is equal to or greater than the threshold S, the parameter $\mu_x$ is calculated as 1. Conversely, if the product of the eigenvalues $\lambda_1 \times \lambda_2$ is less than the threshold S, the parameter $\mu_x$ is calculated as the fourth root of $(S/(\lambda_1 \times \lambda_2))$.

After calculation of the parameter $\mu_x$, the adaptive kernel function is calculated for the pixel of interest. The adaptive kernel function $k_x(x_i-x)$ is calculated with Equation (2).

$$k_x(x_i - x) = \exp\left[-\frac{(x_i - x)^T R^T C_x^{-1} R(x_i - x)}{2h^2 \mu_x^2}\right] \quad (2)$$

In Equation (2), $x_i$ represents the coordinates of the surrounding pixels, x represents the coordinates of the pixel of interest, R represents a 45° rotation matrix, and h is a predetermined design parameter, set for example to 1.

The adaptive kernel function $k_x(x_i-x)$ calculated for each pixel is transmitted to the reference image creation unit 44 and the interpolated image creation unit 45. In the reference image creation unit 44, the G color signal component (first color signal component) with the largest number of elements in the original image signal is transmitted from the distribution unit 41. In the reference image creation unit 44, interpolation of the G color signal components in only one half of all pixels is performed with an adaptive Gaussian interpolation method, so that a reference image signal is generated.

Interpolation of missing pixel signals in the G original image signal component with the adaptive Gaussian interpolation method is now described. Each of the pixels for which the G original image signal component is to be interpolated, i.e. the pixels not including a G color signal component in the original image signal, is designated in order as a pixel of interest. Pixels in a 7×7 region around the pixel of interest are designated as surrounding pixels.

The pixel signal for the pixel of interest is calculated with Equation (3), based on the G color signal component of the surrounding pixels and on the adaptive kernel function.

$$S_x = \frac{1}{\omega_x}\sum_i M_{x_i} S_{x_i} k(x_i - x) \quad (3)$$

Note that $\overline{\omega}_x$ is calculated with Equation (4). $M_{xi}$ is a binary mask set to 1 when the surrounding pixel has a G color signal component and set to 0 when the surrounding pixel does not have a G color signal component. $S_{xi}$ is the G color component of the surrounding pixel.

$$\omega_x = \sum_i M_{x_i} k(x_i - x) \quad (4)$$

The reference image signal formed by the G original image signal component and by the G color signal components interpolated for all pixels designated as pixels of interest are transmitted to the interpolated image creation unit 45. As described above, the adaptive kernel function $k_x(x_i-x)$ and the reference image signal are transmitted from the adaptive kernel calculation unit 43 and the reference image creation unit 44 to the interpolated image creation unit 45. Furthermore, as described above, the G original image signal component, Cy original image signal component, Or original image signal component, B original image signal component, and R original image signal component are transmitted in order from the distribution unit 41 to the interpolated image creation unit 45.

In the interpolated image creation unit 45, the non-generated color signal components are interpolated for all pixels with an adaptive joint bilateral interpolation method. For example, using the G color signal components existing in only half of the pixels, the G color signal components for the other pixels are interpolated.

Similarly, using the Cy color signal components, Or color signal components, B color signal components, and R color signal components existing in only one eighth of the pixels, the Cy color signal components, Or color signal components, B color signal components, and R color signal components for the other pixels are interpolated. Interpolating all of the color signal components yields an interpolated image signal formed so that all pixel signals have all color signal components. Note that while interpolation is performed during creation of the reference image for the G color signal components, interpolation using the reference image is performed separately.

Interpolation of each color signal component with the adaptive joint bilateral interpolation method is now described, using the G color signal component as an example. Each of the pixels for which the G color signal component is to be interpolated, i.e. the pixels not including a G color signal component in the original image signal, is designated in order as a pixel of interest. Pixels in a 7×7 region around the pixel of interest are designated as surrounding pixels.

The color signal component for the pixel of interest is calculated with Equation (5), based on the G color signal component of the surrounding pixels, the adaptive kernel function, and the reference image signal.

$$S_x = \frac{1}{\omega_x}\sum_i M_{x_i} S_{x_i} k(x_i - x) r(I_{x_i} - I_x) \quad (5)$$

In Equation (5), $I_{xi}$ represents the pixel value of a surrounding pixel in the reference image, and $I_x$ represents the pixel value of the pixel of interest in the reference image. Furthermore, $r(I_{xi}-I_x)$ is a weight corresponding to the difference between the pixel values of the pixel of interest and the surrounding pixel.

Interpolation of the G color signal component for the pixel of interest yields a G interpolated image signal component. Subsequently, the Cy color signal component, Or color signal component, B color signal component, and R color signal component are similarly interpolated, yielding a Cy interpolated image signal component, Or interpolated image signal component, B interpolated image signal component, and R interpolated image signal component. By thus interpolating all color signal components, an interpolated image signal is generated.

The CFA of the Embodiment with the above structure including color filters of five or more bands allows for acquiring derivatives in two directions that are common to every pixel, that is, gradient information before performing color interpolation.

In General, in natural images, it is known that correlation between bands is strong in high frequency components. Therefore an image of each band has the same edge structure, and thus it is assumed that all bands have the same gradient information. Therefore, the accuracy sufficient for subsequent image processing and the like can be obtained from derivatives of any color signal components. As in the case of this embodiment, when the correlation between two colors from which a derivative is obtained is strong, more accurate information can be obtained.

Further, derivatives in directions common to every pixel are found, which simplifies processing as compared with cases of finding derivatives in different directions with respect to each pixel. In addition, more accurate gradient information can be acquired with reduced loss of information of high-frequency components due to the conversion for aligning the directions of the gradient information.

The highly accurate gradient information is used for interpolating the missing color signal components, which allows for interpolation with reduced generation of false color. Further, use of the highly accurate gradient information makes it possible to perform highly accurate noise reduction, conversion from multiband into RGB, color conversion and color/gamma correction can be performed.

The present invention has been described based on the drawings and embodiments, yet it should be noted that a person of ordinary skill in the art can easily make a variety of modifications and adjustments based on the present disclosure. Accordingly, these modifications and adjustments should be construed as being included within the scope of the present invention.

For example, in the above-described embodiment, an arrangement of five-band color filters is defined. However, the same effect as that of this embodiment can be obtained in an arrangement in which any given pixel is interposed between two color filters of the same type.

For example, the same effect as in this embodiment can be obtained by a CFA 2100a provided with Cy, Or, B, and R color filters as shown in FIG. 14G. In the CFA 2100a, with any given pixel being a pixel of interest, pixels used for calculation of a derivative always contain a highly related color. Specifically, Or color filters are always provided diagonally to a R color filter. A highly related color is always contained when a derivative is calculated, and thus more highly accurate calculation of derivatives can be realized.

Further, even in a CFA 2101a provided with G, Cy, Or, B, and R color filters as shown in FIG. 15, the bands of color filters on the upper right and lower left of each pixel are the same, whereas the bands of color filters of the pixels px on the upper left and lower right thereof are the same. Thus, as in this embodiment, derivatives can be determined directly from original image signals.

Figure 16:
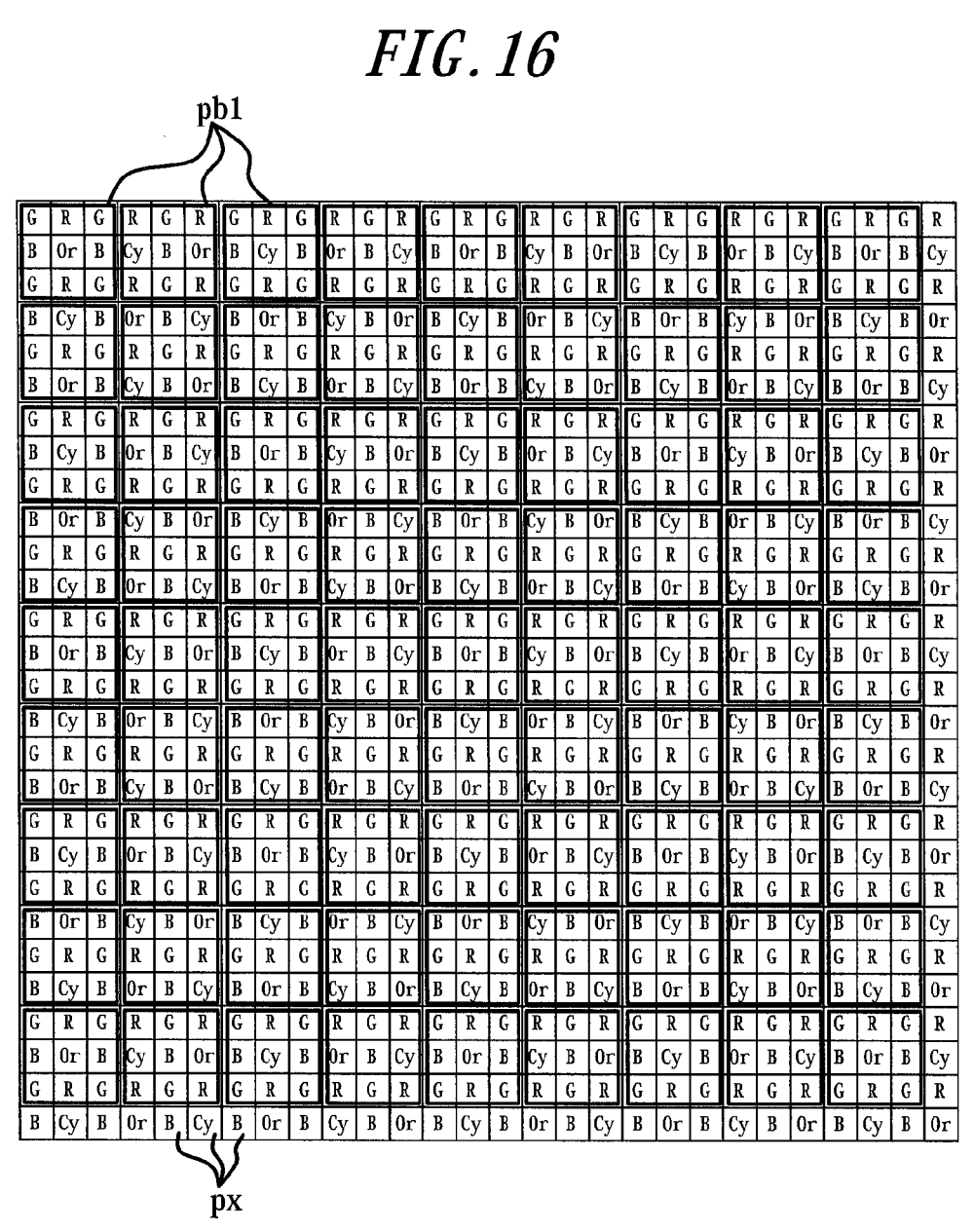

In addition, CFA 2101a can also achieve thinning readout as in this embodiment. For example, as shown in FIG. 16, pixel signals can alternatively be read out from each first pixel block pb1 composed of pixels px arranged in three rows and three columns. As with this embodiment, the type of the color filter of a pixel px in the center of a first pixel block pb1 is regarded as the type of a color filter of the first pixel block pb1, so that the arrangement of the color filters in the first pixel block pb1 is the same as the CFA 21a.

Figure 17:
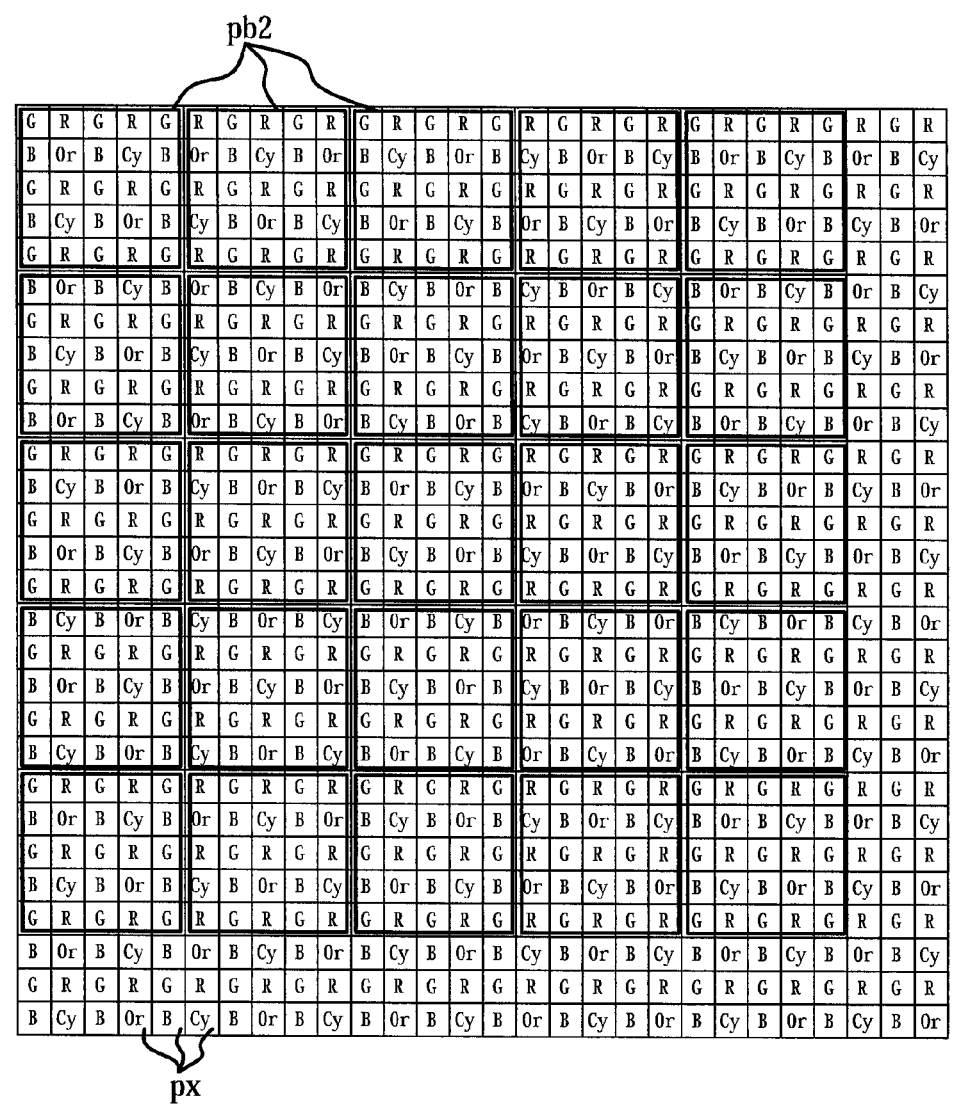

Moreover, for example, as shown in FIG. 17, pixel signals can be read out from each second pixel block pb2 composed of pixels px arranged in five rows and five columns. As with this embodiment, the type of the color filter of a pixel px in the center of a second pixel block pb2 is regarded as the type of a color filter of the second pixel block pb2, so that the arrangement of the color filters in the second pixel block pb2 is the same as the CFA 21a.

Further, in this embodiment, although two pixels used for calculating a derivative of a pixel of interest are adjacent to the pixel of interest, these two pixels are not necessarily adjacent thereto as long as they are at the same distance from the pixel of interest. A derivative may be found, for example, by calculating the difference between the pixel arranged two pixels right and two pixels up from the pixel of interest and the pixel arranged two pixels left and two pixels down therefrom.

Color filters allowing for finding derivatives in directions common to every pixel from pixels adjacent to the pixel of interest are limited to five to eight types. On the other hand, color filters for finding derivatives from the pixels at the same distance from the pixel of interest are not limited to five to eight types, and nine or more types of color filters may be used in the structure.

Thus, even if the color filters of two pixels adjacent to the pixel of interest are of different type, the same effect as in this embodiment can be obtained when color filters are arranged such that the color filters of two pixels arranged at the same distance from the pixel of interest are of the same type.

For example, when using color filter arrays 2102a and 2103a shown in FIG. 18 and FIG. 19, the same effects as in the above embodiment can be achieved. Specifically, for any pixel px that is the pixel of interest in the CFAs 2102a and 2103a, the pixel arranged two pixels up and two pixels right from the pixel of interest, and the pixel arranged two pixels down and two pixels left from the pixel of interest have the same type of color filters. Further, the pixel arranged two pixels up and two pixels left from the pixel of interest and the pixel arranged two pixels down and two pixels right from the pixel of interest have the same type of color filters.

Further, in this embodiment, the pixels used for calculating a derivative are arranged at an interval of one pixel both in the u direction and the v direction from the pixel of interest. However, the interval in the u direction may be different from that in the v direction. A derivative can be calculated by dividing by the length according to the interval.

In this embodiment, a derivative is calculated with respect to the u direction and v direction of the pixel of interest. However, the directions of the derivatives are not limited to the u direction and v direction. With the color filter array allowing for calculation of a derivative in two different directions, the same effect as that of this embodiment can be obtained by reading out pixel signals in accordance with the color filter array to calculate the derivative.

For example, in CFA 21a according to this embodiment, for any pixel being a pixel of interest, the color filters of two pixels arranged at an interval of two pixels on both sides of the pixel of interest along the row direction are of the same type, and the color filters of two pixels at an interval of two pixels on both sides of the pixel of interest along the column direction are also of the same type. Accordingly, with respect to an original image signal output from the CFA 21a, when a derivative is calculated based on pixel signals of two pixels arranged at an interval of two pixels in the row direction from the pixel of interest and a derivative is calculated based on pixel signals of two pixels at an interval of two pixels in the column direction from the pixel of interest, the same effects as in this embodiment can be achieved.

Moreover, in this embodiment, derivatives are found with respect to two directions; however, the directions with respect to which derivatives are to be found are not limited to two directions. With the color filter array allowing for calculation of a derivative in at least two directions common to each pixel, the same effect as that of this embodiment can be obtained by reading out pixel signals in accordance with the color filter array to calculate the derivative.

For example, in CFA 21a according to this embodiment, for any pixel being a pixel of interest, the color filters of two pixels arranged at an interval of two pixels on both sides of the pixel of interest along the row direction are of the same type, and the color filters of two pixels at an interval of two pixels on both sides of the pixel of interest along the column direction are also of the same type. Meanwhile, the color filters of two pixels at an interval of two pixels on both sides of the pixel of interest along the u direction are of the same type, and the color filters of two pixels at an interval of two pixels on both sides of the pixel of interest along the v direction are of the same type. Accordingly, when a derivative is calculated based on pixel signals of two pixels each arranged at an interval of two pixels in four directions, the same effect as that of this embodiment can be obtained. When the number of directions with respect to which derivatives are found is increased, more accurate gradient information can be obtained.

Further, intervals from each pixel may vary between pixels used for calculating a derivative. For example, in CFA 21a, for G color filters, the color filters of four pixels arranged at an interval of two pixels on both sides of the pixel of interest along the row and column directions are of the same type. Further, for four types of color filters other than the G color filters, the color filters of four pixels arranged at an interval of one pixel on both sides of the pixel of interest along the row and column directions are of the same type. Accordingly, when derivatives of pixels at pixel intervals different depending on the type of the pixels are found with original image signals output from the CFA 21a, the same effect as that of this embodiment can be obtained.

Figure 20:
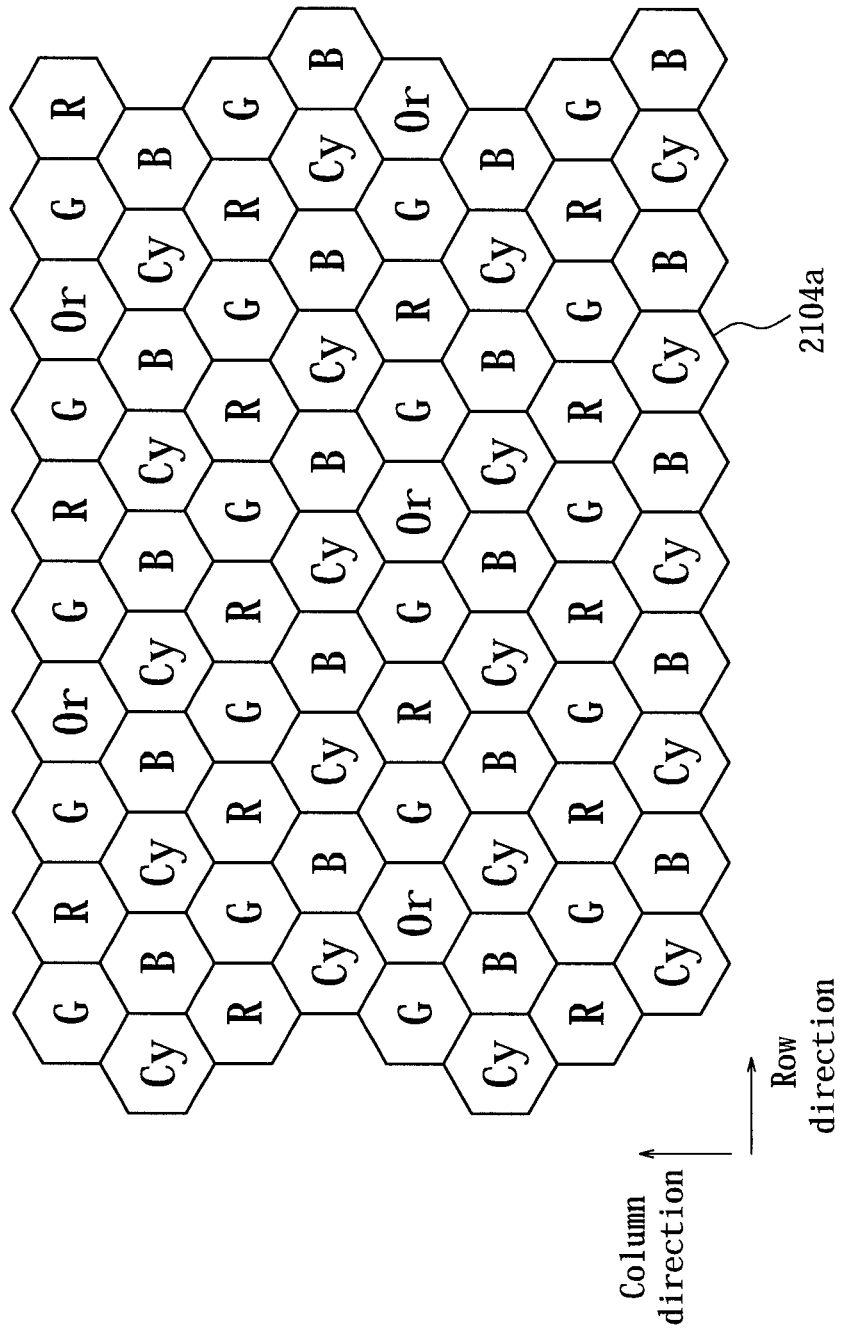
FIG. 20 is an array diagram showing the structure of a color filter array having five-band color filters according to a fifth modification.

Further, with a honeycomb image sensor as shown in FIG. 20, the same effect as in Embodiment 1 can be obtained. In a CFA 2104a shown in FIG. 20, for any pixel being a pixel of interest, the color filters of two pixels arranged at an interval of two pixels on both sides of the pixel of interest along a direction at 60° from the row direction are of the same type, and the color filters of two pixels at an interval of two pixels on both sides of the pixel of interest along a direction at 30° from the column direction are also of the same type.

Figure 21:
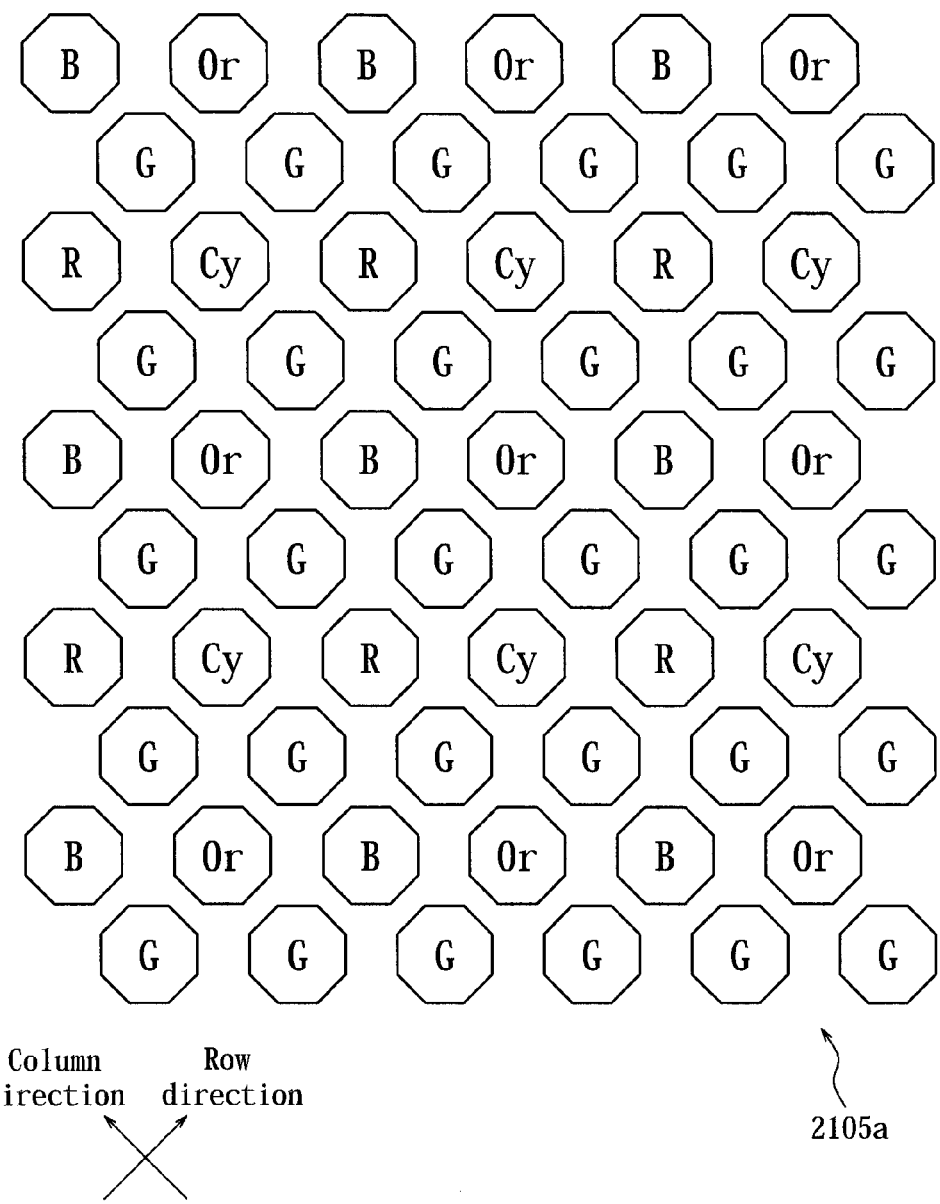
FIG. 21 is an array diagram showing the structure of a color filter array having five-band color filters according to a sixth modification.

Further, as shown in FIG. 21, with the image sensor in which pixels arranged in a matrix are inclined at 45°, the same effect as that of the first embodiment can be obtained. In CFA 2105a shown in FIG. 21, for any pixel being a pixel of interest, the color filters of two pixels arranged on both sides of the pixel of interest along the column and row directions each are of the same type.

Further, in this embodiment, five-band color filters are provided in CFA 21a. Alternatively, color filters of six or more bands may be provided.

Figure 22:
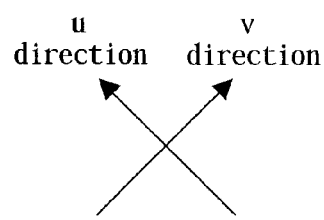
FIG. 22 is an array diagram showing the structure of a color filter array having six-band color filters according to a seventh modification.

For example, a CFA 2106a provided with C1 to C6 color filters that are six-band color filters as shown in FIG. 22 allows for calculation of derivatives of any pixel px in the u direction and v direction. Further, for the CFA 2106a, as in this embodiment, a pixel signal of only a single pixel px located in the center of each second pixel block including pixels px arranged in five rows and five columns may be output, thereby calculating the derivatives of each pixel block.

Figure 23:
FIG. 23 is an array diagram showing the structure of a color filter array having six-band color filters according to an eighth modification.
Figure 24:
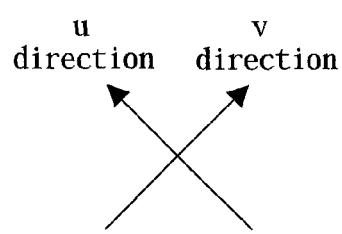
FIG. 24 is an array diagram showing the structure of a color filter array having six-band color filters according to a ninth modification.

Further, CFAs 2107a and 2108a provided with C1 to C6 color filters that are six-band color filters as shown in FIGS. 23 and 24 allows for calculating derivatives of any pixel px using pixels px arranged at an interval of two pixels in the u direction and v direction from the pixel of interest.

Figure 25:
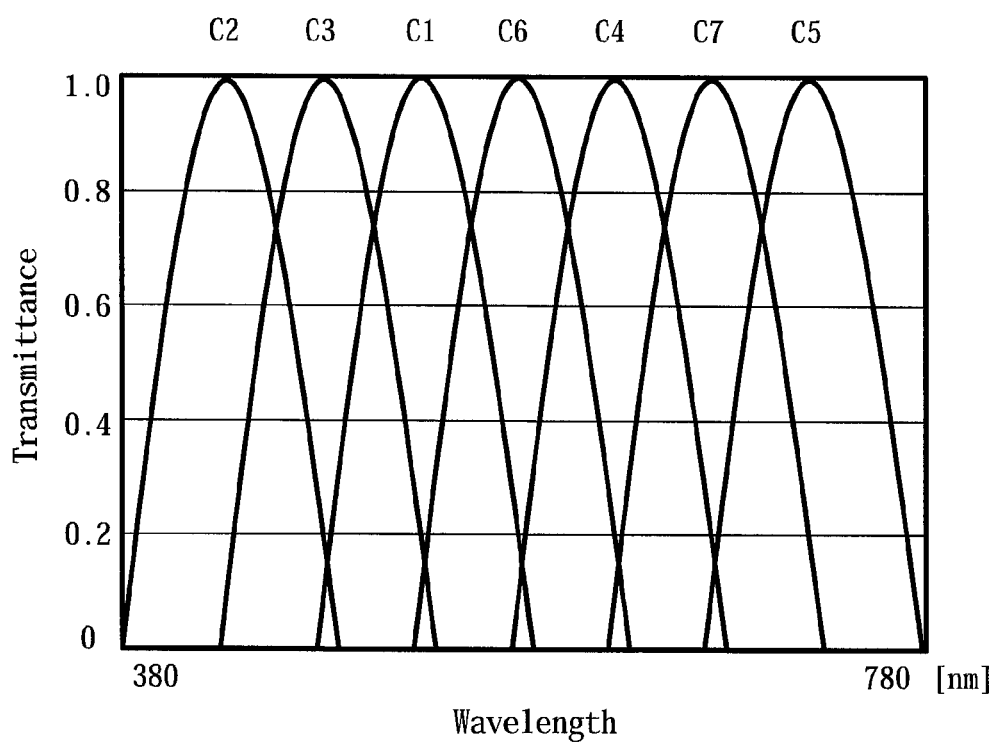
FIG. 25 shows the spectral sensitivity characteristics of seven-band color filters in a color filter array of a tenth modification.
Figure 26:
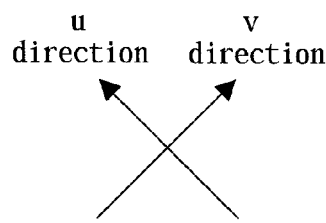
FIG. 26 is an array diagram showing the structure of a color filter array having seven-band color filters according to the tenth modification.

For example, also with a CFA 2109a shown in FIG. 26 using C1 to C7 color filters having the spectral sensitivity shown in FIG. 25, the same effect as in this embodiment can be achieved. Further, for the CFA 2109a, as in this embodiment, a pixel signal of only a single pixel located in the center of each second pixel block including pixels px arranged in five rows and five columns may be output, thereby calculating the derivatives of each pixel block.

Figure 27:
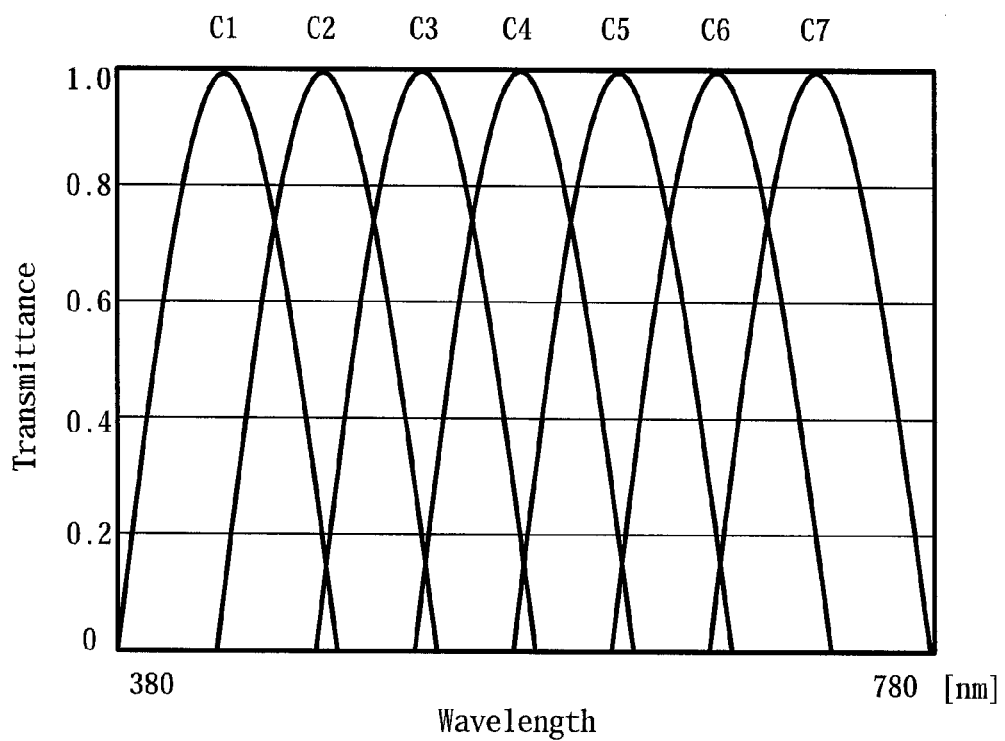
FIG. 27 shows the spectral sensitivity characteristics of seven-band color filters in a color filter array of an eleventh modification.
Figure 28:
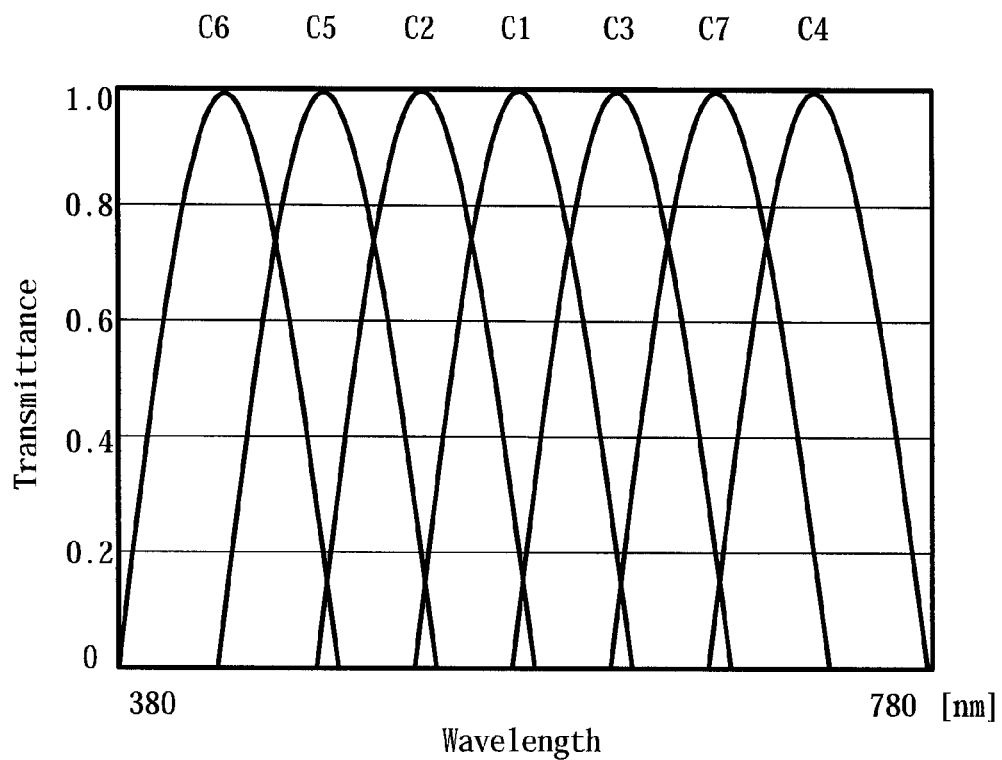
FIG. 28 shows the spectral sensitivity characteristics of seven-band color filters in a color filter array of a twelfth modification.
Figure 29:
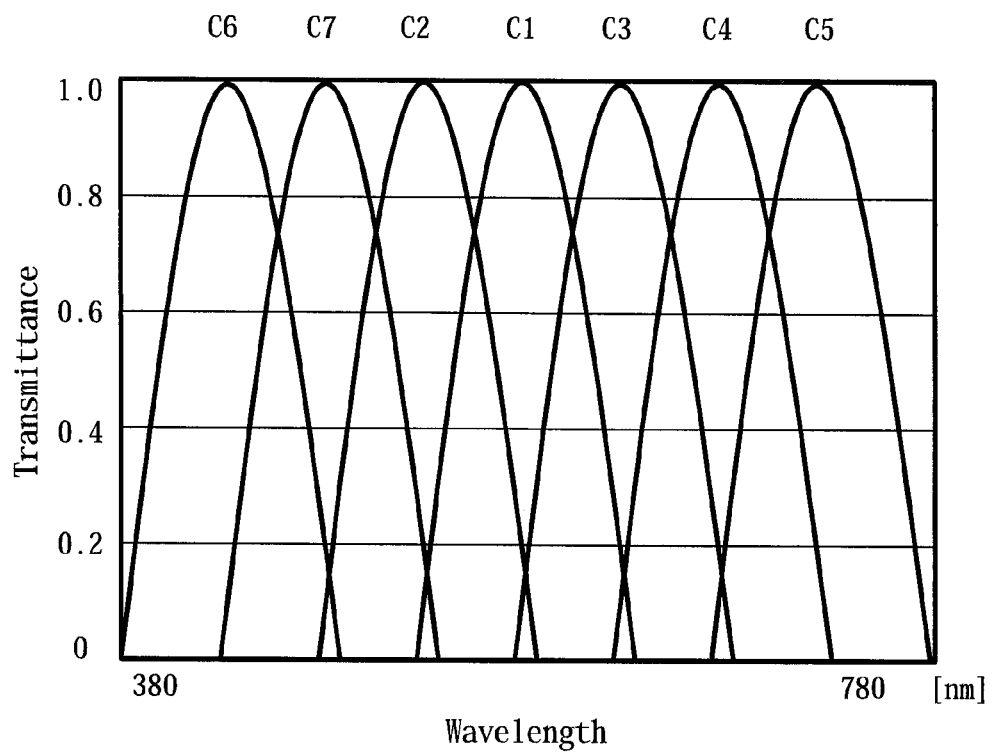
FIG. 29 shows the spectral sensitivity characteristics of seven-band color filters in a color filter array of a thirteenth modification.
Figure 30:
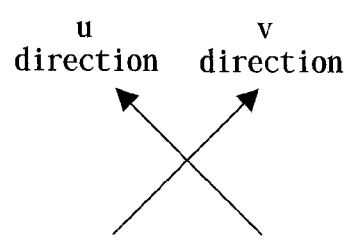
FIG. 30 is an array diagram showing the structure of a color filter array having seven-band color filters according to the eleventh modification.
Figure 31:
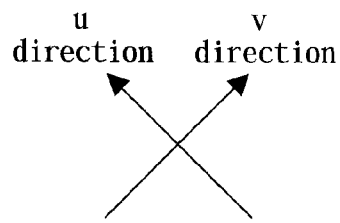
FIG. 31 is an array diagram showing the structure of a color filter array having seven-band color filters according to the twelfth modification.
Figure 32:
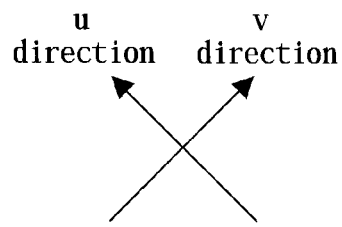
FIG. 32 is an array diagram showing the structure of a color filter array having seven-band color filters according to the thirteenth modification.

Further, CFAs 2110a, 2111a, and 2112a shown in FIGS. 30 to 32 each using C1 to C7 color filters having the spectral sensitivities shown in FIGS. 27 to 29 also allows for calculation of derivatives of any pixel px using pixels arranged at an interval of two pixels in the u direction and v direction from the pixel of interest.

Figure 33:
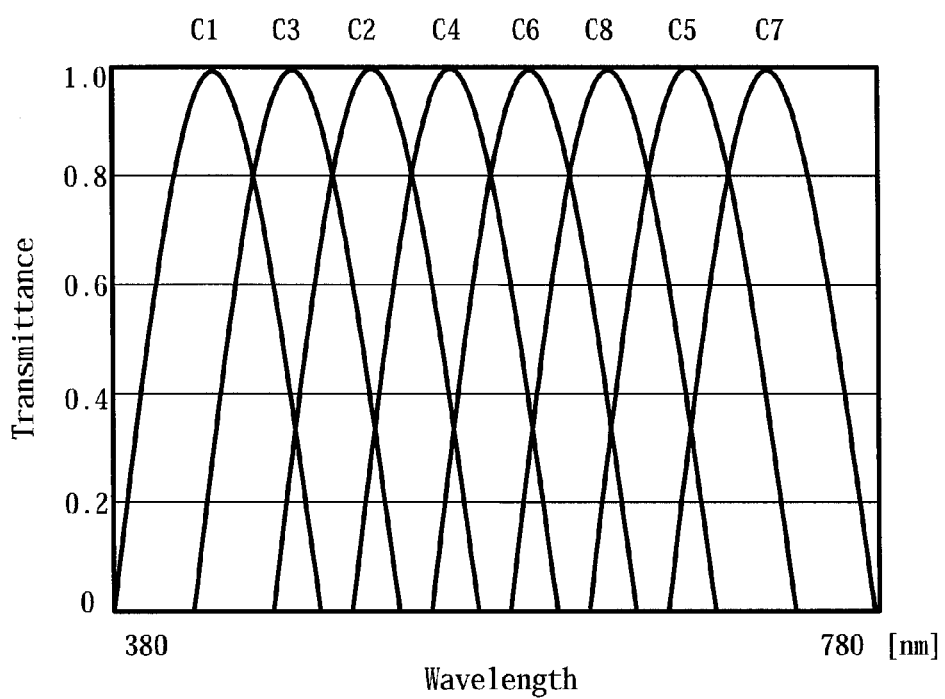
FIG. 33 shows the spectral sensitivity characteristics of eight-band color filters in a color filter array of a fourteenth modification.
Figure 34:
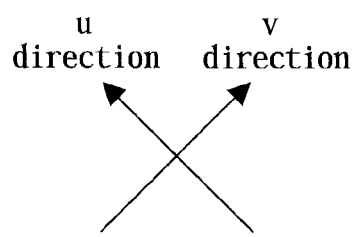
FIG. 34 is an array diagram showing the structure of a color filter array having eight-band color filters according to the fourteenth modification.

For example, a CFA 2113a shown in FIG. 34 using C1 to C8 color filters having the spectral sensitivity shown in FIG. 33 also allows for calculation of derivatives of any pixel px in the u direction and v direction. Further, for the CFA 2113a, as in this embodiment, pixel signals of only a single pixel px located in the center of each of the first, second, and third pixel blocks including pixels px arranged in three rows and three columns, five rows and five columns, and seven rows and seven columns, respectively may be output, thereby calculating the derivatives of each pixel block.

Figure 35:
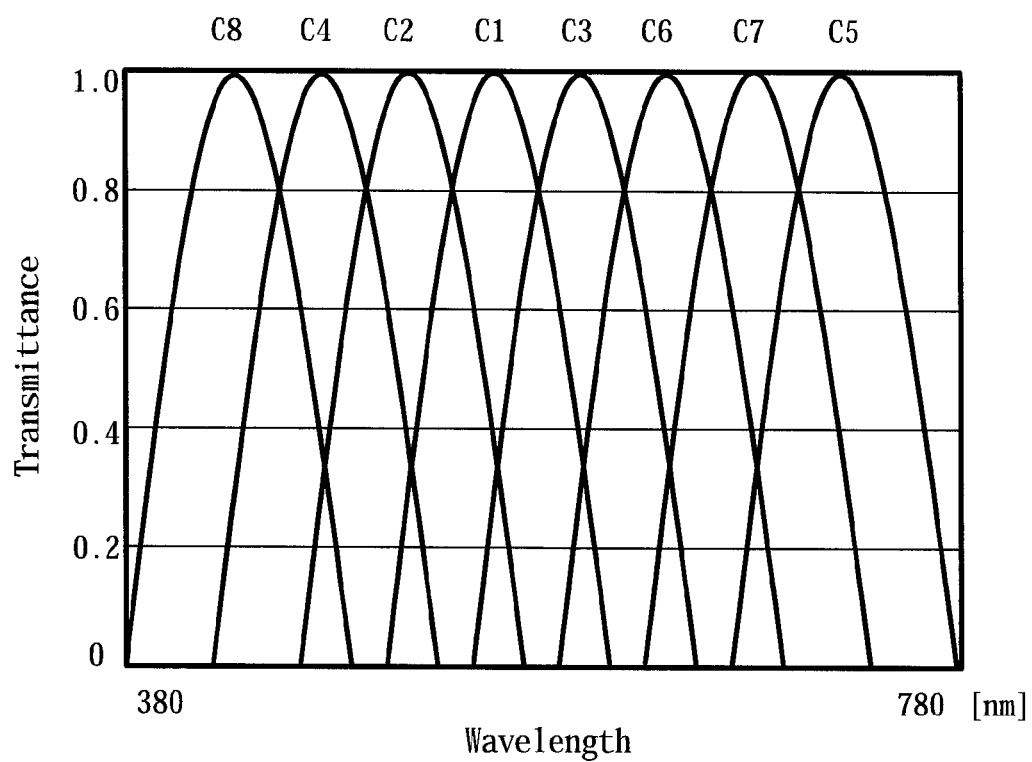
FIG. 35 shows the spectral sensitivity characteristics of eight-band color filters in a color filter array of a fifteenth modification.
Figure 36:
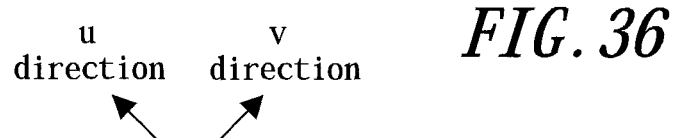
FIG. 36 is an array diagram showing the structure of a color filter array having eight-band color filters according to the fifteenth modification.

Further, a CFA 2114a shown in FIG. 36 using C1 to C8 color filters having the spectral sensitivity shown in FIG. 35 also allows for calculation of derivatives of any pixel px using pixels px arranged at an interval of two pixels in the u direction and v direction.

Figure 37:
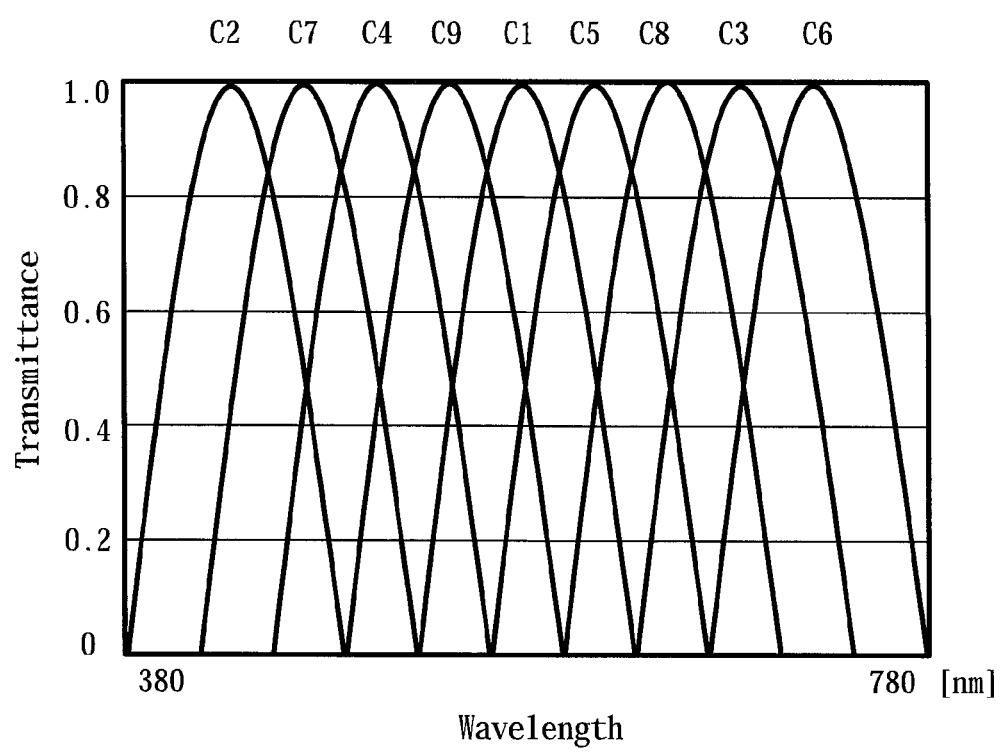
FIG. 37 shows the spectral sensitivity characteristics of nine-band color filters in a color filter array of a sixteenth modification.
Figure 38:
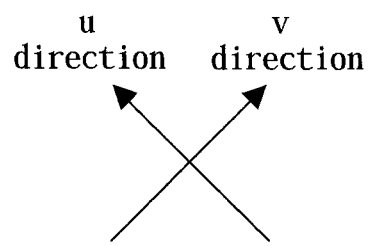
FIG. 38 is an array diagram showing the structure of a color filter array having nine-band color filters according to the sixteenth modification.

For example, a CFA 2115a shown in FIG. 38 using C1 to C9 color filters having the spectral sensitivity shown in FIG. 37 also allows for calculation of derivatives of any pixel px using pixels px arranged at an interval of two pixels in the u direction and v direction. Further, for the CFA 2115a, as in this embodiment, a pixel signal of only a single pixel px located in the center of each second pixel block including pixels px arranged in five rows and five columns may be output, thereby calculating the derivatives of each pixel block.

Figure 39:
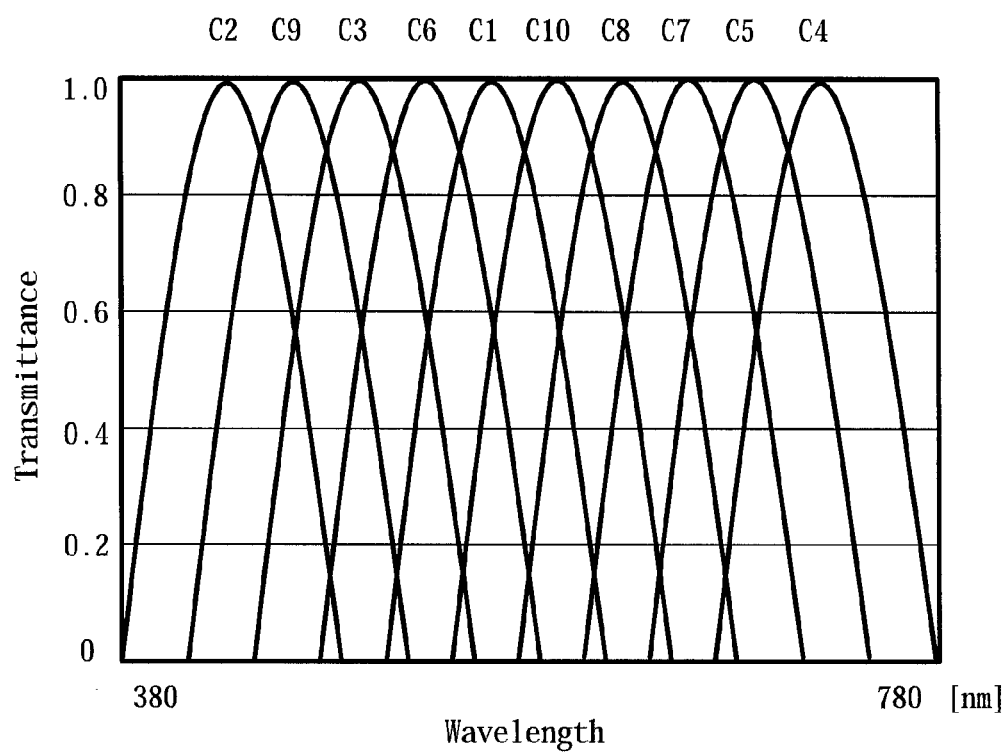
FIG. 39 shows the spectral sensitivity characteristics of ten-band color filters in a color filter array of a seventeenth modification.
Figure 40:
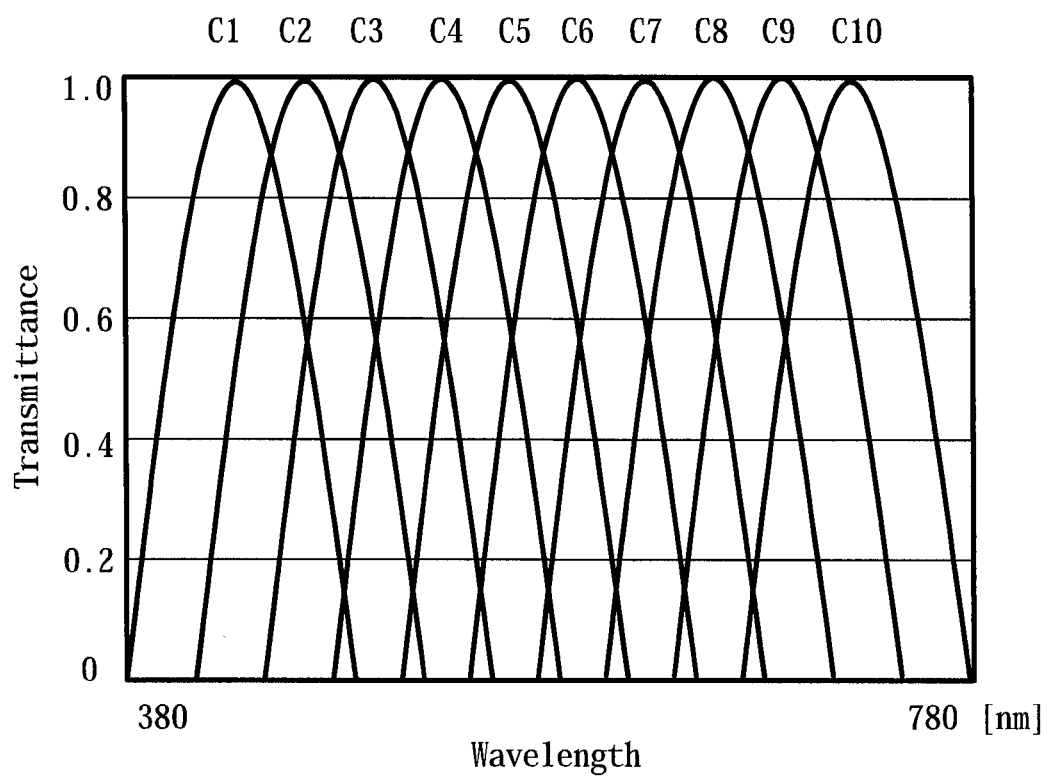
FIG. 40 shows the spectral sensitivity characteristics of ten-band color filters in a color filter array of an eighteenth modification.
Figure 41:
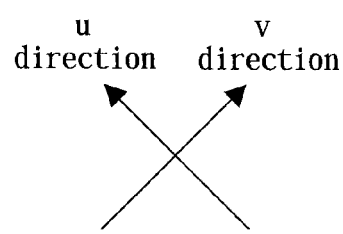
FIG. 41 is an array diagram showing the structure of a color filter array having ten-band color filters according to the seventeenth modification.
Figure 42:
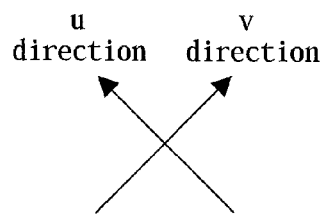
FIG. 42 is an array diagram showing the structure of a color filter array having ten-band color filters according to the eighteenth modification.

For example, CFAs 2116a and 2117a shown in FIGS. 41 and 42 each using C1 to C10 color filters having the spectral sensitivities shown in FIGS. 39 and 40 also allows for calculation of derivatives of any pixel px using pixels px arranged at an interval of two pixels in the u direction and v direction. Note that the CFA 2116a and 2117a include color filter repetition units of pixels arranged in eight rows and eight columns. Further, for the CFAs 2116a and 2117a, as in this embodiment, a pixel signal of only a single pixel px located in the center of each first pixel block including pixels px arranged in three rows and three columns may be output, thereby calculating the derivatives of each pixel block.

Further, derivatives are calculated using all pixel signals in normal readout mode in this embodiment; however, it is not necessary to calculate derivatives of all pixels.

For example, for the CFA 2110a shown in FIG. 30, the derivatives of only C1, C2, C4, C6, and C7 color filters may be calculated. With respect to the CFA 2110a, for any pixel being a pixel of interest, two pixels arranged on both sides of the pixel of interest at an interval of two pixels in each of the u direction, v direction, row direction, and column direction have the same type of color filters, which allows for calculation of derivatives. However, when a pixel having a color filter (C1, C2, C4, C6, C7) of the above-mentioned types is a pixel of interest, two pixels arranged on both sides of the pixel of interest at an interval of one pixel in the u direction and v direction have the same type of color filters, which allows for calculation of derivatives.

Further, only a pixel signal of a pixel having the highest sample density like the C4 color filter in the CFA 2110a may be used to calculate the derivatives. In particular, as in this embodiment, in a case where one type of color filters are provided in a proportion of 50% of all color filters, as with the G color filters in the Bayer color array, although the accuracy is lower as compared with derivatives calculated from all pixels, derivatives can be calculated from pixel signals of only the one type of color filters, to be used in subsequent signal processing.

An optimal method for calculating derivatives varies depending on the CFAs. In the case of the CFA 21a shown in FIG. 2, for any pixel being a pixel of interest, derivatives can be calculated from pixels adjacent to the pixel of interest in the u direction and v direction. Further, in the case of the CFA 21a, for any pixel being a pixel of interest, derivatives can be calculated from two pixels arranged at an interval of two pixels along the row direction and column direction from the pixel of interest. As such, there are cases where derivatives of a given CFA can be calculated by a plurality of methods. For such a CFA, an optimal method for calculating derivatives can be selected in terms of subsequent signal processing using an optimal derivative found, the processing speed, and the like. It should be noted that derivatives calculated from pixels adjacent to a pixel of interest are more accurate than derivatives calculated from pixels arrange at an interval of two pixels each from the pixel of interest. Moreover, it is preferable to calculate derivatives with respect to all the pixel positions than to leave derivatives of pixels not being calculated.

Further, in this embodiment, thinning readout can be performed for increasing the frame rate. In order to reduce occurrence of false images due to the thinning, pixel addition may be performed in the readout.

For example, in the first thinning readout mode in this embodiment, two pixels px arranged on the upper right and lower left of the center of a first pixel block pb1 (see FIG. 3) have the same type of color filters. In this case, pixel signals of the two pixels px may be added and output as a pixel signal of the first pixel block pb1. When the color signal component of the output pixel signal is designated to correspond to the band of the color filter of the first pixel block pb1, the arrangement of the color filters in the first pixel blocks pb1 is the same as the arrangement of the color filters in the CFA 21a.

Further, in the second thinning readout mode in this embodiment, five pixels located in the center and four corners of a second pixel block pb2 (see FIG. 5) have the same type of color filters. In this case, pixel signals of the five pixels may be added and output as a pixel signal of the second pixel block pb2. When the color signal component of the output pixel signal is designated to correspond to the band of the color filter of the second pixel block pb2, the arrangement of the color filters in the second pixel blocks pb2 is the same as the arrangement of the color filters in the CFA 21a.

Further, in this embodiment, in the thinning readout modes, readout is performed using pixels arranged in three rows and three columns, five rows and five columns, or seven rows and seven columns as pixel blocks. Alternatively, for color filter repetition units each including four rows and four columns of pixels, a pixel signal may be output from a single pixel at a predetermined position in each pixel block including (2k+3) rows and (2k+3) columns of pixels (k is an integer equal to or more than 0). For pixel blocks having such a structure, the arrangement of the color filters in the pixel blocks is the same as the arrangement of the color filter in the CFA 21a.

Further, in this embodiment, in thinning readout, a pixel signal is output from a pixel in the center of a pixel block; alternatively, the pixel signal may be output from a pixel at any position in the pixel block.

In this embodiment, calculated derivatives are transmitted to the adaptive kernel calculation unit 43, the NR processing unit 32, the MB-RGB conversion unit 33, the color conversion unit 34, and the color/gamma correction unit 35; alternatively, the derivatives may be transmitted to at least one of them, or may be used for any processing using the derivatives. For example, the derivatives can be used for edge enhancement, local contrast calculation, feature quantity extraction, and the like.

REFERENCE SIGNS LIST

10: Digital camera
20: Image sensor
21a, 2100a, 2101a, 2102a, 2103a, 2104a, 2105a, 2106a, 2107a, 2108a, 2109a, 2110a, 2111a, 2112a, 2113a, 2114a, 2115a, 2116a, 2117a: Color filter array (CFA)
21u: Color filter repetition unit
30: Image signal processing unit
40: Multiband demosaicing (MB) unit
pb1 to pb3: First to third pixel blocks
px: Pixel

The invention claimed is:

1. An imaging apparatus comprising:
a color filter array comprising five or more types of color filters having different spectral sensitivity characteristics, with at least two types of color filters among the five or more types of the color filters being designated as color filters of interest, the five or more color filters being arranged in a two dimensional form such that two of the color filters arranged on both sides of each of the color filters of interest at a first interval along a first direction are of the same type, and two of the color filters arranged at a second interval on both sides of the color filter of interest along a second direction different from the first direction are of the same type;
an image sensor comprising a plurality of pixels covered by the color filters of any type in the color filter array, the plurality of pixels generating pixel signals in accordance with the quantity of received light; and
one or more processors comprising hardware, wherein the one or more processors are configured to implement a derivative calculation unit that, in a single frame image captured by the image sensor,
designates the pixels covered by the type of the color filters serving as the color filters of interest provided on the color filter array as a pixel of interest one pixel at a time in order,
calculates a first derivative information based on pixel signals generated by two of the pixels arranged on both sides of the pixel of interest at the first interval along the first direction, and
calculates a second derivative information based on pixel signals generated by two of the pixels arranged on both sides of the pixel of interest at the second interval along the second direction.

2. The imaging apparatus according to claim 1, wherein the first interval and the second interval are equal.

3. The imaging apparatus according to claim 2, wherein the color filters are of five to eight types and the first interval and the second interval are one pixel interval each.

4. The imaging apparatus according to claim 1, wherein:
the color filters are arranged in a matrix; and
angles between the first direction and a row direction and between the second direction and the row direction are 45° each, and angles between the first direction and a column direction and between the second direction and the column direction are 45° each.

5. The imaging apparatus according to claim 1, wherein the color filters are arranged in a matrix, and the first direction coincides with the row direction and the second direction coincides with the column direction.

6. The imaging apparatus according to claim 1, wherein among the at least two types of color filters arranged as the color filters of interest, two types of color filters are adjacent to each other; and
only with respect to the pixels covered by color filters of one of the two types adjacent to each other, the first interval and the second interval are one pixel interval.

7. The imaging apparatus according to claim 1, wherein:
the color filters are arranged in a matrix; and
first color filters among the color filters of five or more types are arranged every other pixel in all rows and columns along a row direction and a column direction, respectively.

8. The imaging apparatus according to claim 1, wherein:
the color filters are arranged in a matrix; and
the first color filters among the color filters of five or more types are arranged in a checkerboard pattern.

9. The imaging apparatus according to claim 1, wherein the color filters other than a certain type of color filters among the five or more types of color filters are arranged in the same proportions.

10. The imaging apparatus according to claim 1, wherein a peak wavelength of spectral sensitivity characteristics of two color filters of the same type arranged at the first interval on both sides of the color filter of interest along the first direction is adjacent to a peak wavelength of spectral sensitivity characteristics of two color filters of the same type arranged at the second interval on both sides of the color filter of interest along the second direction.

11. The imaging apparatus according to claim 1, wherein a peak wavelength of spectral sensitivity characteristics of two color filters of the same type arranged at the first interval on both sides of the color filter of interest along the first direction is adjacent to a peak wavelength of spectral sensitivity characteristics of the color filter of interest.

12. The imaging apparatus according to claim 1, wherein the derivative calculation unit calculates the first derivative information and the second derivative information using only pixel signals generated by the pixels of the first interval and the second interval being one pixel interval.

13. The imaging apparatus according to claim 1, wherein:
two of the color filters arranged at a third interval on both sides of the color filter of interest along a third direction that equally divides an angle between the first direction and the second direction are of the same type;
two of the color filters arranged at a fourth interval on both sides of the color filter of interest along a fourth direction perpendicular to the third direction are of the same type; and
the derivative calculation unit calculates third derivative information based on pixel signals generated by two of the pixels arranged at the third interval on both sides of the pixel of interest along the third direction, and calculates fourth derivative information based on pixel signals generated by two of the pixels arranged at the fourth interval on both sides of the pixel of interest along the fourth direction.

14. The imaging apparatus according to claim 1, wherein the one or more processors are further configured to implement an image processing unit that implements at least one of, performing edge enhancement on image signals composed of a plurality of the pixel signals, calculating the contrast of all or local image signals, extracting the feature quantity of an image corresponding to the image signals, and interpolating the pixel signal corresponding to color signal components of color filters of all types different from the type of the color filters covering the pixels.

15. The imaging apparatus according to claim 1, further comprising an image sensor driver for performing normal processing in which pixel signals are generated by all of the pixels and output therefrom, and thinning processing different from the normal processing, wherein:

a light-receiving surface of the image sensor, which is provided with the plurality of the pixels is divided to form a plurality of pixel blocks having an equal number of the pixels;

the image sensor driver orders the image sensor to output a thinning pixel in the thinning processing such that, with the color filter covering the thinning pixel that is one of the pixels at a predetermined position in one of the pixel blocks being designated as a color filter of the pixel block, an arrangement of the color filters in all pixel blocks is the same as an arrangement of the color filters in the color filter array; and when the image sensor performs the thinning processing, the derivative calculation unit designates each of the pixel block as a pixel block of interest, calculates third derivative information based on pixel signals generated by two of the pixel blocks arranged on both sides of the pixel block of interest at an interval of the first interval multiplied by the number of the pixel blocks along the first direction, along the first direction, and calculates fourth derivative information based on pixel signals generated by thinning pixels in two of the pixel blocks arranged on both sides of the pixel block of interest at an interval of the second interval multiplied by the number of pixels in the pixel blocks along the second direction, along the second direction.

* * * * *

UNITED STATES PATENT AND TRADEMARK OFFICE
CERTIFICATE OF CORRECTION

PATENT NO.        : 9,250,121 B2
APPLICATION NO.   : 14/064612
DATED             : February 2, 2016
INVENTOR(S)       : Masayuki Tanaka et al.

Page 1 of 1

It is certified that error appears in the above-identified patent and that said Letters Patent is hereby corrected as shown below:

On the title page, item 73

IT SHOULD READ:

TOKYO INSTITUTE OF TECHNOLOGY, Tokyo (JP);
OLYMPUS CORPORATION, Tokyo (JP);

Signed and Sealed this
Ninth Day of August, 2016

Michelle K. Lee
*Director of the United States Patent and Trademark Office*